(12) United States Patent
Inukai et al.

(10) Patent No.: US 7,636,056 B2
(45) Date of Patent: Dec. 22, 2009

(54) DELTA SIGMA MODULATOR OPERATING WITH DIFFERENT POWER SOURCE VOLTAGES

(75) Inventors: Fumihito Inukai, Kyoto (JP); Hitoshi Kobayashi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/124,079

(22) Filed: May 20, 2008

(65) Prior Publication Data
US 2008/0291069 A1    Nov. 27, 2008

(30) Foreign Application Priority Data
May 22, 2007    (JP) .............................. 2007-135584

(51) Int. Cl.
*H03M 3/00* (2006.01)
(52) U.S. Cl. ...................................... 341/143; 341/155
(58) Field of Classification Search .................. 341/143
See application file for complete search history.

(56) References Cited

U.S. PATENT DOCUMENTS 5,153,593 A * 10/1992 Walden et al. .............. 341/143

6,400,297 B1 * 6/2002 Tucker ....................... 341/143

FOREIGN PATENT DOCUMENTS

| JP | 06-283980 | 10/1994 |
|---|---|---|
| JP | 2004-297165 | 10/2004 |

* cited by examiner

*Primary Examiner*—Khai M Nguyen
(74) *Attorney, Agent, or Firm*—Dickinson Wright PLLC

(57) ABSTRACT

In a delta sigma modulator including first and second integration circuits connected in cascade, each as a component thereof, first and second power source terminals for supplying first and second different power source voltages to the first and second integration circuits are provided. The first power source voltage is supplied to the former-stage first integration circuit having a SNR which is largely affected by the magnitude of the power source voltage. The second power source voltage lower than the first power source voltage is supplied to the latter-stage second integration circuit having a SNR which is not largely affected by the magnitude of the power source voltage.

5 Claims, 20 Drawing Sheets

FIG. 4A
FIG. 4B
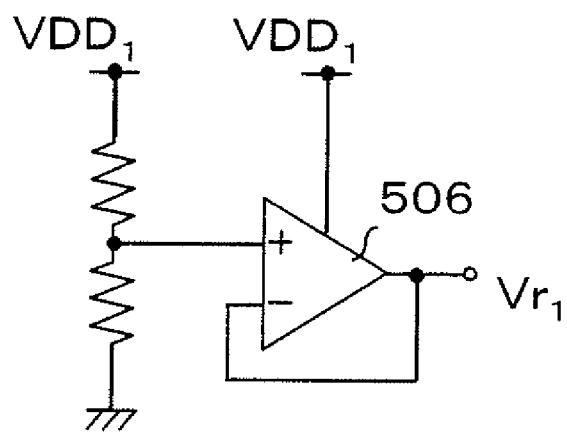
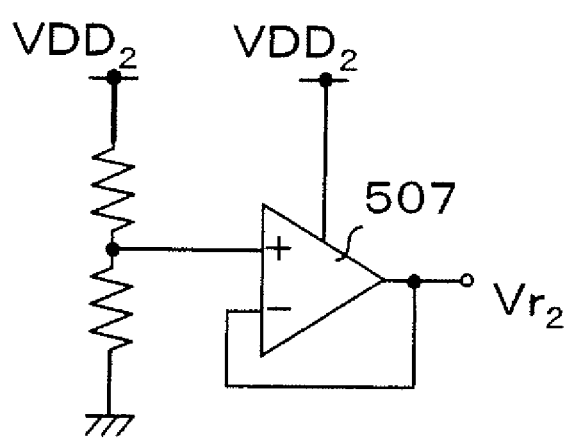

DELTA SIGMA MODULATOR OPERATING WITH DIFFERENT POWER SOURCE VOLTAGES

BACKGROUND OF THE INVENTION

1. Field of the Invention

The present invention relates to a delta sigma modulator which includes an integration circuit and a quantizer connected in cascade, each as a component thereof, and also comprises a first power source terminal connected to the former-stage integration circuit, and a second power source terminal connected to the latter-stage quantizer to allow a reduction in power consumption without degrading a SNR (Signal to Noise Ratio).

The present invention also relates to a delta sigma modulator which includes a first integration circuit and a second integration circuit connected in cascade, each as a component thereof, and also comprises a first power source terminal connected to the former-stage first integration circuit and a second power source terminal connected to the latter-stage second integration circuit to allow a reduction in power consumption without degrading the SNR.

The present invention further relates to a delta sigma modulator which has a plurality of delta sigma modulation type quantization loops connected in cascade in multiple stages, and also comprises a first power source terminal connected to a first integration circuit composing the first-stage delta sigma modulation type quantization loop, and a second power source terminal connected to a second integration circuit composing second and subsequent delta sigma modulation type quantization loops to allow a reduction in power consumption without degrading the SNR.

2. Description of the Related Art

A system using a delta sigma modulator has been conventionally known, and used in an AD converter for digital audio equipment or the like. When the system is used in portable equipment, in particular, low power consumption is considered to be important.

Conventionally, an oversampling AD converter often referred to as a delta sigma AD converter has been well known. The delta sigma AD converter digitizes an analog signal at an extremely high oversampling rate, and simultaneously performs noise shaping for shifting noise to a high frequency range, and a digital filtering process after the noise shaping. This allows the delta sigma AD converter to implement an effective resolution higher than a quantized output of a delta sigma modulator. Thereafter, the effective sampling rate is returned to a Nyquist rate using decimation.

The noise shaping is a technique which lowers the level of quantization noise showing a uniform-level frequency distribution in a low frequency range in which an original signal is present by an differential/integral operation in accordance with delta sigma modulation without changing the frequency characteristics of the original signal, and conversely raises the level of quantization noise in a high frequency range in which a sampling frequency is present.

The effect of the noise shaping is larger as the order of a delta sigma modulation is higher, i.e., the number of stages of integrators composing a delta sigma modulator is larger. Accordingly, the noise shaping effect of a second-order delta sigma modulator is higher than that of a first-order delta sigma modulator.

FIG. 13 shows a structure of a single-loop second-order delta sigma modulator as a conventional embodiment. A delta sigma modulator 1 comprises first and second integration circuits 10 and 11, amplifiers 20 and 21 each having an amplification factor $a_1$, an amplifier 22 having an amplification factor $a_2$, a quantizer 2, adders/subtractors 3 and 4, and DA converters 30 and 31. The delta sigma modulator 1 operates with a power source voltage $VDD_1$ supplied from a power source terminal 600.

The first integration circuit 10 receives a signal obtained by subtracting, from a signal obtained by passing an analog input signal Ain through the amplifier 20, a signal obtained by passing a feedback reference voltage (positive voltage+$Vr_1$ or negative voltage-$Vr_1$) generated from the DA converter 30 through the amplifier 21 by means of the adder/subtractor 3.

The second integration circuit 11 receives a signal obtained by subtracting, from an output of the first integration circuit 10, a signal obtained by passing a feedback reference voltage (positive voltage+$Vr_1$ or negative voltage-$Vr_1$) generated from the DA converter 31 through the amplifier 22 by means of the adder/subtractor 4.

The quantizer 2 quantizes an output of the second integration circuit 11 to a 1-bit digital output signal Dout.

The DA converters 30 and 31 generate the feedback reference voltage (positive voltage+$Vr_1$ or negative voltage-$Vr_1$) mentioned above from the 1-bit digital output signal Dout of the quantizer 2.

Typically, the 1-bit digital output signal Dout of the delta sigma modulator 1 is inputted to a digital filter circuit for the retrieval of a needed signal band. The delta sigma modulator 1 composes an AD converter.

As a result, when the digital output signal Dout of the delta sigma modulator 1 is normalized such that a digital full scale value equals 1, it can be given by the following transmission function:

$$Dout \cong \frac{Ain}{2 \cdot Vr_1} + \frac{(1-Z^{-1})^2 Q \cdot 2 \cdot Vr_1}{2 \cdot Vr_1 \cdot [1-(2-a_2)Z^{-1}+(1+a_1-a_2)Z^{-2}]}$$

$$= \frac{Ain}{2 \cdot Vr_1} + \frac{(1-Z^{-1})^2 Q}{1-(2-a_2)Z^{-1}+(1+a_1-a_2)Z^{-2}} \quad \text{Expression 1}$$

where the digital full scale value corresponds to the voltage±$Vr_1$ of an analog value, and Q represents quantization noise generated in the quantizer 2.

A description will be given to a specific circuit structure for implementing the delta sigma modulator 1 of FIG. 13 with reference to FIG. 14.

FIG. 14 is a circuit diagram showing an example of the specific circuit structure of a single-loop second-order delta sigma modulator 101 using a switched capacitor circuit. The first and second integration circuits 10 and 11, the DA converters 30 and 31, and the adders/subtractors 3 and 4 of FIG. 13 are composed of the switched capacitor circuit comprising switches 41 to 52 and 61 to 72, capacitors $C_{11}$ to $C_{14}$ and $C_{21}$ to $C_{24}$, operational amplifiers 6 and 7, and buffers 5 and 8 in FIG. 14. $VDD_1$ is a power source voltage supplied to the second-order delta sigma modulator 101. 601 is a power source terminal.

The analog input signal Ain is integrated by the operational amplifier 6 using the reference voltage $Vr_1$ as well as charging and discharging between the capacitors $C_{11}$ and $C_{14}$.

A feedback signal is processed as follows. The digital output signal Dout is converted by the buffer circuit 5 to digital signals S1p and S1n. Then, by turning ON/OFF the switches 46 and 50 in accordance with the levels of the digital signals S1p and S1n, a DA conversion using the reference voltage $Vr_1$ and a zero voltage is performed. The DA converted voltage is integrated by the operational amplifier 6 using the charging and discharging between the capacitors $C_{12}$ and $C_{13}$.

In this manner, the first integration circuit 10 and the DA converter 30 are constructed. The amplification factor $a_1$ of the amplifier 20 shown in FIG. 13 corresponds to the capacitance ratio $C_{11}/C_{14}$, while the amplification factor $a_1$ of the amplifier 21 shown in FIG. 13 corresponds to the capacitance ratios $C_{12}/C_{14}$ and $C_{13}/C_{14}$.

Next, the output signal of the operational amplifier 6 is integrated by the operational amplifier 7 using the reference voltage $Vr_1$ as well as the charging and discharging between the capacitors $C_{21}$ and $C_{24}$.

The feedback signal is processed as follows. The digital output signal Dout is converted by the buffer circuit 5 to the digital signals S1$p$ and S1$n$. Then, by turning ON/OFF the switches 66 and 70 in accordance with the levels of the digital signals S1$p$ and S1$n$, a DA conversion using the reference voltage $Vr_1$ and a zero voltage is performed. The DA converted voltage is integrated by the operational amplifier 7 using the charging and discharging between the capacitors $C_{22}$ and $C_{23}$.

In this manner, the second integration circuit 11 and the DA converter 31 are constructed. The amplification factor $a_2$ of the amplifier 22 shown in FIG. 13 corresponds to the capacitance ratios $C_{22}/C_{24}$ and $C_{23}/C_{24}$.

The output signal of the operational amplifier 7 is quantized by a comparator 12, and outputted as the 1-bit digital signal Dout. The comparator 12 corresponds to the quantizer 2 of FIG. 13.

The buffer circuit 5 outputs the digital signals S1$p$ and S1$n$ which are each in-phase or anti-phase with the 1-bit digital output signal Dout of the delta sigma modulator 101. The switches 46 and 66 are under the ON/OFF control of the digital signal S1$n$. The switches 50 and 70 are under the ON/OFF control of the digital signal S1$p$, which is opposite to the ON/OFF control over the switches 46 and 66.

The buffer circuit 8 receives a control clock for the switched capacitor circuit, and outputs digital signals φ1$p$ and φ1$n$ which are each in-phase or anti-phase with the control clock. The switches 41, 44, 45, 48, 51, 52, 61, 64, 65, 68, 71 and 72 are under the ON/OFF control of the digital signal φ1$p$. The switches 42, 43, 47, 49, 62, 63, 67, and 69 are under the ON/OFF control of the digital signal φ1$n$, which is opposite to the control over the switches 41, 44, 45, 48, 51, 52, 61, 64, 65, 68, 71 and 72.

As shown in FIG. 15, the buffer circuit 5 comprises an inverter $IN_1$ composed of a P-channel transistor 81A and an N-channel transistor 82A, an inverter $IN_2$ composed of a P-channel transistor 81B and an N-channel transistor 82B, and an inverter $IN_3$ composed of a P-channel transistor 81C and an N-channel transistor 82C. A signal which is in-phase with the signal inputted to an input terminal IN is outputted from an output terminal OUTp, while a signal which is anti-phase with the signal inputted to the input terminal IN is outputted from an output terminal OUTn.

The buffer circuit 8 has the same structure as that of the buffer circuit 5.

The switches 41 to 52 and 61 to 72 are each composed of, e.g., an N-channel transistor 83 shown in FIG. 16, and intermittently interrupts (ON/OFF) a signal with the timing of a signal CLK (clock) inputted to the gate thereof. The signal CLK is supplied from each of the buffer circuits 5 and 8.

FIG. 17 shows an example of respective circuits which implement the operational amplifiers 6 and 7, and the comparator 12. These circuits are composed of P-channel transistors 84A to 84C, N-channel transistors 85A and 85B, and current sources 86A and 86B.

The reference voltage $Vr_1$ is supplied by, e.g., dividing the power source voltage $VDD_1$ with resistors 405A and 405B, and amplifying the divided voltage with an operational amplifier 406, as shown in FIG. 18.

Thus, the delta sigma modulator shown in FIG. 13 is composed of the switched capacitor circuit.

As a CMOS circuit has been increasingly scaled down from 0.35 μm to 0.18 μm, and to 0.13 μm, the operation voltage thereof has also been reduced from 3.3 V to 1.8 V, and to 1.2 V. To reduce the power consumption of a delta sigma modulator, it is effective to minimize the power source voltage thereof, and operate the delta sigma modulator.

However, when the delta sigma modulator is operated with a lowered power source voltage, the dynamic range of the circuit is narrowed so that it is necessary to simultaneously reduce the amplitude of the input signal as well as the feedback reference voltage. As a result, the SNR (Signal to Noise Ratio) during an AD conversion deteriorates. In addition, a voltage for driving the MOS switch of the switched capacitor circuit also lowers to lead to the problem that the ON resistance of the switch increases, and the turning ON/OFF of the switch becomes difficult. Thus, it is not easy to lower the power source voltage of an analog circuit.

A description will be given hereinbelow to the ON resistance of the switch mentioned above. The ON resistance of the switch of FIG. 16 can be given by:

$$Ron \approx 1/(\mu * Cox * W/L * (Vgs - Vt))$$

where μ is a mobility, Cox is the thickness of a gate oxide film, W is a gate width, L is a gate length, Vgs is a gate-source drive voltage, and Vt is a threshold. Accordingly, when the voltage Vgs decreases, the ON resistance Ron increases.

Even microfabrication processes using design rules of 0.18 μm or below have many examples in which a transistor adapted to perform a 3.3 V operation by varying the thickness of the gate oxide film is embedded for an external interface (I/F). As a result, there is disclosed a method which lowers power consumption by using a 3.3 V transistor for an analog circuit such as a delta sigma modulator, and operates, with a low power source voltage, only a digital circuit such as a digital filter connected in a stage subsequent thereto or the like (see Japanese Unexamined Patent Publication No. HEI 6-283980).

SUMMARY OF THE INVENTION

It is therefore an object of the present invention to provide a delta sigma modulator which allows a reduction in power consumption without degrading the SNR during an AD conversion.

A delta sigma modulator in accordance with a first aspect of the present invention is a delta sigma modulator including an integration circuit, and a quantizer for quantizing an output of the integration circuit, an output of the quantizer being feedbacked to the input side of the integration circuit, the delta sigma modulator comprising: a first power source terminal for supplying a first operation power source voltage to the integration circuit; and a second power source terminal for supplying a second operation power source voltage lower than the first operation power source voltage to the quantizer.

The arrangement makes it possible to reduce power consumption without degrading the SNR on the whole by supplying a higher power source voltage to the former-stage integration circuit in which noise has not been reduced, and a reduction in power source voltage largely affects the SNR, while supplying a lower power source voltage to the latter-stage quantizer in which noise has been already reduced by noise shaping performed by the integration circuit, and a reduction in power source voltage does not largely affect the SNR.

In the former-stage integration circuit, the noise of an input signal has not eventually been attenuated. Therefore, by supplying the higher power source voltage, it is possible to eliminate the need to reduce the amplitude of the input signal, and prevent the deterioration of the SNR. In the latter-stage quantizer, on the other hand, the noise of an input signal is attenuated by noise shaping so that, even when power consumption is reduced by supplying the lower power source voltage, the SNR is not degraded thereby. As a result, it is possible to implement a delta sigma modulator with reduced power consumption without degrading the SNR on the whole.

In the delta sigma modulator in accordance with the first aspect of the present invention mentioned above, the integration circuit preferably includes an operational amplifier supplied with the first operation power source voltage, and the quantizer preferably includes a comparator supplied with the second operation power source voltage.

In the delta sigma modulator in accordance with the first aspect of the present invention mentioned above, the integration circuit may include a capacitor, a switch for intermittently interrupting a charge/discharge current to the capacitor, and a drive circuit supplied with the first operation power source voltage to drive the switch, and the quantizer may include a operational amplifier supplied with the second operation power source voltage. The drive circuit mentioned above preferably receives a signal in accordance with a level of a power source voltage supplied to the second power source terminal, and outputs a signal in accordance with a level of a power source voltage supplied to the first power source terminal.

In the delta sigma modulator in accordance with the first aspect of the present invention mentioned above, the integration circuit may include an operational amplifier supplied with the first operation power source voltage, a capacitor, a switch for intermittently interrupting a charge/discharge current to the capacitor, and a drive circuit supplied with the first operation power source voltage to drive the switch, and the quantizer may include a comparator supplied with the second operation power source voltage. The drive circuit mentioned above preferably receives a signal in accordance with a level of a power source voltage supplied to the second power source terminal, and outputs a signal in accordance with a level of a power source voltage supplied to the first power source terminal.

In the delta sigma modulator in accordance with the first aspect of the present invention mentioned above, a feedback path from an output terminal of the quantizer to the input side of the integration circuit is preferably provided with a DA converter receiving the output of the quantizer to generate a feedback reference voltage to be inputted to the integration circuit. The feedback reference voltage mentioned above is preferably generated based on a power source voltage supplied to the first power source terminal.

A delta sigma modulator in accordance with a second aspect of the present invention is a delta sigma modulator including a first integration circuit, a second integration circuit for integrating an output of the first integration circuit, and a quantizer for quantizing an output of the second integration circuit, an output of the quantizer being feedbacked to the input side of the first integration circuit, the delta sigma modulator comprising: a first power source terminal for supplying a first operation power source voltage to the first integration circuit; and a second power source terminal for supplying a second operation power source voltage lower than the first operation power source voltage to the second integration circuit.

The arrangement makes it possible to reduce power consumption without degrading the SNR on the whole by supplying a higher power source voltage to the former-stage first integration circuit in which noise has not been reduced, and a reduction in power source voltage largely affects the SNR, while supplying a lower power source voltage to the latter-stage second integration circuit in which noise has been already reduced by noise shaping performed by the first integration circuit, and a reduction in power source voltage does not largely affect the SNR.

In the former-stage first integration circuit, the noise of an input signal has not eventually been attenuated. Therefore, by supplying the higher power source voltage, it is possible to eliminate the need to reduce the amplitude of the input signal, and prevent the deterioration of the SNR. In the latter-stage second integration circuit, on the other hand, the noise of an input signal is attenuated by noise shaping performed by the former-stage integration circuit so that, even when power consumption is reduced by supplying the lower power source voltage, the SNR is not degraded thereby. As a result, it is possible to implement a delta sigma modulator with reduced power consumption without degrading the SNR on the whole.

In the delta sigma modulator in accordance with the second aspect of the present invention mentioned above, the second operation power source voltage is preferably supplied from the second power source terminal to the quantizer.

In the delta sigma modulator in accordance with the second aspect of the present invention mentioned above, the first integration circuit preferably includes a first operational amplifier supplied with the first operation power source voltage, and the second integration circuit preferably includes a second operational amplifier supplied with the second operation power source voltage.

In the delta sigma modulator in accordance with the second aspect of the present invention mentioned above, the first integration circuit may include a first capacitor, a first switch for intermittently interrupting a charge/discharge current to the first capacitor, and a first drive circuit supplied with the first operation power source voltage to drive the first switch, and the second integration circuit may include a second capacitor, a second switch for intermittently interrupting a charge/discharge current to the second capacitor, and a second drive circuit supplied with the second operation power source voltage to drive the second switch. The first drive circuit mentioned above preferably receives a signal in accordance with a level of a power source voltage supplied to the second power source terminal, and outputs a signal in accordance with a level of a power source voltage supplied to the first power source terminal.

In the delta sigma modulator in accordance with the second aspect of the present invention mentioned above, the first integration circuit may include a first operational amplifier supplied with the first operation power source voltage, a first capacitor, a first switch for intermittently interrupting a charge/discharge current to the first capacitor, and a first drive circuit supplied with the first operation power source voltage to drive the first switch, and the second integration circuit may include a second operational amplifier supplied with the second operation power source voltage, a second capacitor, a second switch for intermittently interrupting a charge/discharge current to the second capacitor, and a second drive circuit supplied with the second operation power source voltage to drive the second switch. The first drive circuit mentioned above preferably receives a signal in accordance with a level of a power source voltage supplied to the second power source terminal, and outputs a signal in accordance with a level of a power source voltage supplied to the first power source terminal.

In the delta sigma modulator in accordance with the second aspect of the present invention mentioned above, a feedback path from an output terminal of the quantizer to the input side of each of the first and second integration circuits is preferably provided with a DA converter receiving the output of the quantizer to generate a feedback reference voltage to be inputted to each of the first and second integration circuits. The feedback reference voltage mentioned above is preferably generated based on a power source voltage supplied to the first power source terminal.

In the delta sigma modulator in accordance with the second aspect of the present invention mentioned above, feedback paths from an output terminal of the quantizer to the input sides of the first and second integration circuits may be provided with first and second DA converters receiving the output of the quantizer to generate first and second feedback reference voltages to be inputted to the first and second integration circuits. The first and second feedback reference voltages are preferably generated based on respective power source voltages supplied to the first and second power source terminals.

A delta sigma modulator in accordance with a third aspect of the present invention is a delta sigma modulator comprising: a first-stage delta sigma modulation type quantization loop including a first integration circuit, and a first quantizer for quantizing an output of the first integration circuit, an output of the first quantizer being feedbacked to the input side of the first integration circuit; a subsequent-stage delta sigma modulation type quantization loop connected in cascade to the first-stage delta sigma modulation type quantization loop, and including a second integration circuit, and a second quantizer for quantizing an output of the second integration circuit, an output of the second quantizer being feedbacked to the input side of the second integration circuit; and a noise removal circuit receiving an output of the first-stage delta sigma modulation type quantization loop, and an output of the subsequent-stage delta sigma modulation type quantization loop to remove noise included in the output of the first-stage delta sigma modulation type quantization loop, the delta sigma modulator further comprising: a first power source terminal for supplying a first operation power source voltage to the first integration circuit; and a second power source terminal for supplying a second operation power source voltage lower than the first operation power source voltage to the second integration circuit.

The arrangement makes it possible to reduce power consumption without degrading the SNR on the whole by supplying a higher power source voltage to the first integration circuit in the first-stage delta sigma modulation type quantization loop in which noise has not been reduced, and a reduction in power source voltage largely affects the SNR, while supplying a lower power source voltage to the second integration circuit in the subsequent-stage delta sigma modulation type quantization loop in which noise has been already reduced by noise shaping performed by the first integration circuit, and a reduction in power source voltage does not largely affect the SNR.

In the former-stage first integration circuit, the noise of an input signal has not eventually been attenuated. Therefore, by supplying the higher power source voltage, it is possible to eliminate the need to reduce the amplitude of the input signal, and prevent the deterioration of the SNR. In the latter-stage second integration circuit, on the other hand, the noise of an input signal is attenuated by noise shaping performed by the former-stage integration circuit so that, even when power consumption is reduced by supplying the lower power source voltage, the SNR is not degraded thereby. As a result, it is possible to implement a delta sigma modulator with reduced power consumption without degrading the SNR on the whole.

In the delta sigma modulator in accordance with the third aspect of the present invention mentioned above, the second operation power source voltage is preferably supplied from the second power source terminal to each of the first and second quantizers.

In the delta sigma modulator in accordance with the third aspect of the present invention mentioned above, the first integration circuit preferably includes a first operational amplifier supplied with the first operation power source voltage, and the second integration circuit preferably includes a second operational amplifier supplied with the second operation power source voltage.

In the delta sigma modulator in accordance with the third aspect of the present invention mentioned above, the first integration circuit may include a first capacitor, a first switch for intermittently interrupting a charge/discharge current to the first capacitor, and a first drive circuit supplied with the first operation power source voltage to drive the first switch, and the second integration circuit may include a second capacitor, a second switch for intermittently interrupting a charge/discharge current to the second capacitor, and a second drive circuit supplied with the second operation power source voltage to drive the second switch. The first drive circuit mentioned above preferably receives a signal in accordance with a level of a power source voltage supplied to the second power source terminal, and outputs a signal in accordance with a level of a power source voltage supplied to the first power source terminal.

In the delta sigma modulator in accordance with the third aspect of the present invention mentioned above, the first integration circuit may include a first operational amplifier supplied with the first operation power source voltage, a first capacitor, a first switch for intermittently interrupting a charge/discharge current to the first capacitor, and a first drive circuit supplied with the first operation power source voltage to drive the first switch, and the second integration circuit may include a second operational amplifier supplied with the second operation power source voltage, a second capacitor, a second switch for intermittently interrupting a charge/discharge current to the second capacitor, and a second drive circuit supplied with the second operation power source voltage to drive the second switch. The first drive circuit mentioned above preferably receives a signal in accordance with a level of a power source voltage supplied to the second power source terminal, and outputs a signal in accordance with a level of a power source voltage supplied to the first power source terminal.

In the delta sigma modulator in accordance with the third aspect of the present invention mentioned above, a feedback path from an output terminal of the first quantizer to the input side of the first integration circuit is preferably provided with a first DA converter receiving the output of the first quantizer to generate a first feedback reference voltage to be inputted to the first integration circuit, and a feedback path from an output terminal of the second quantizer to the input side of the second integration circuit is preferably provided with a second DA converter receiving the output of the second quantizer to generate a second feedback reference voltage to be inputted to the second integration circuit. The first and second feedback reference voltages mentioned above are preferably generated based on respective power source voltages supplied to the first and second power source terminals.

BRIEF DESCRIPTION OF THE DRAWINGS

FIGS. 4A and 4B are circuit diagrams each showing an example of a reference voltage generation circuit;

DESCRIPTION OF THE PREFERRED EMBODIMENTS

Figure 1:
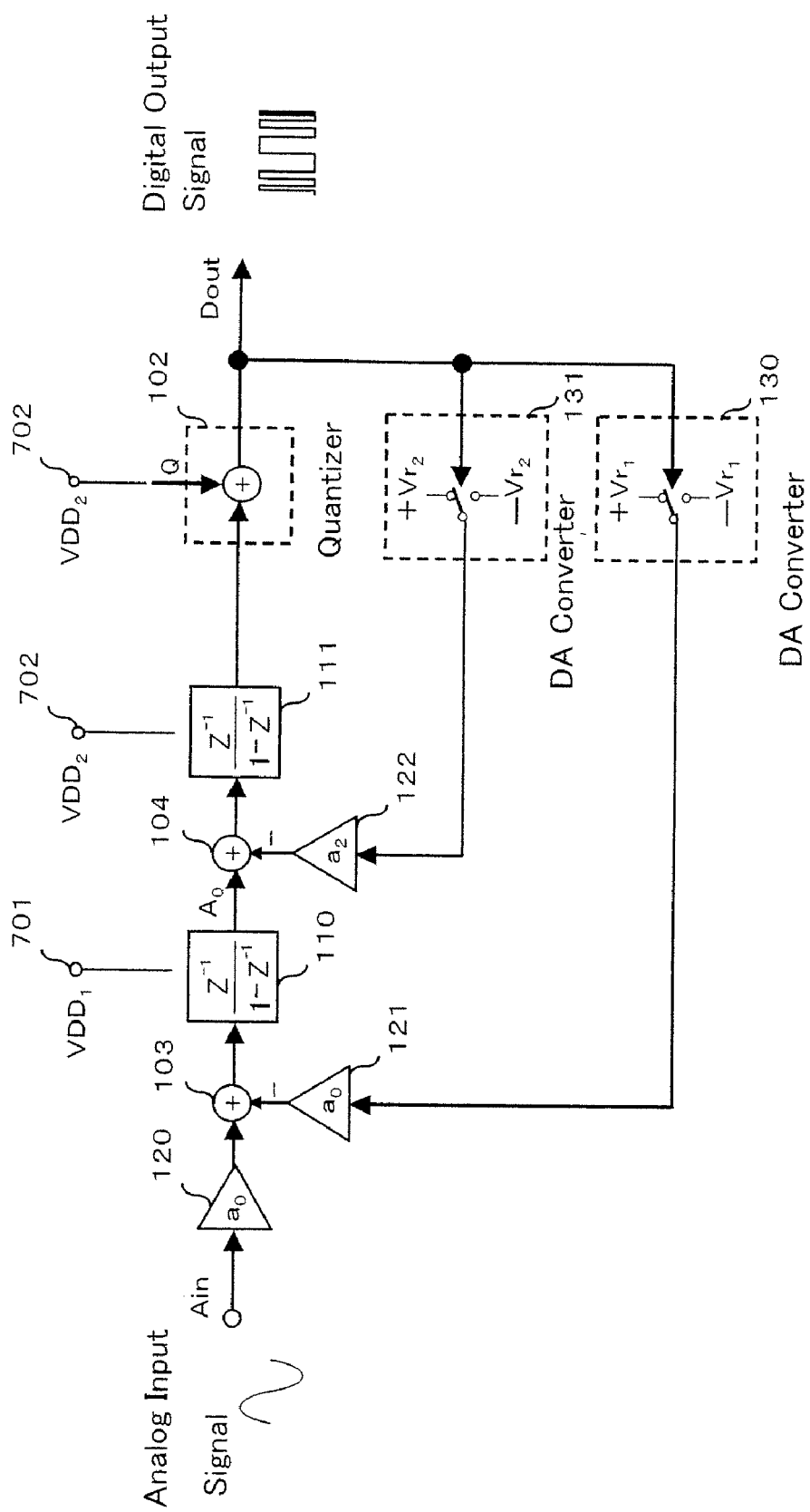
FIG. 1 is a block diagram showing a structure of a delta sigma modulator in a first embodiment of the present invention.

Referring now to the drawings, the embodiments of the present invention will be described hereinbelow.

FIG. 1 shows a structure of a single-loop second-order delta sigma modulator as a first embodiment of the present invention. The delta sigma modulator comprises first and second integration circuits 110 and 111, amplifiers 120 and 121 each having an amplification factor $a_0$, an amplifier 122 having an amplification factor $a_2$, a quantizer 102 made of, e.g., a comparator, adders/subtractors 103 and 104, and DA converters 130 and 131. The delta sigma modulator operates with respective power source voltages $VDD_1$ and $VDD_2$ ($VDD_1 > VDD_2$) supplied from power source terminals 701 and 702.

The first integration circuit 110 operates with the power source voltage $VDD_1$ supplied from the first power source terminal 701, and receives a signal obtained by subtracting, from a signal obtained by passing an analog input signal Ain through the amplifier 120, a signal obtained by passing a first feedback reference voltage (positive voltage+$Vr_1$ or negative voltage−$Vr_1$) generated from the DA converter 130 through the amplifier 121 by means of the adder/subtractor 103.

The second integration circuit 111 operates with the power source voltage $VDD_2$ supplied from the second power source terminal 702, and receives a signal obtained by subtracting, from an output Ao of the first integration circuit 110, a signal obtained by passing a second feedback reference voltage (positive voltage+$Vr_2$ or negative voltage−$Vr_2$) generated from the DA converter 131 through the amplifier 122 by means of the adder/subtractor 104.

The quantizer 102 operates with the power source voltage $VDD_2$ supplied from the second power source terminal 702, and quantizes an output of the second integration circuit 111 to a 1-bit digital output signal Dout.

The first DA converter 130 generates the first feedback reference voltage (positive voltage+$Vr_1$ or negative voltage−$Vr_1$) mentioned above from the 1-bit digital output signal Dout from the quantizer 102.

The second DA converter 131 generates the second feedback reference voltage (positive voltage+$Vr_2$ or negative voltage−$Vr_2$) mentioned above from the 1-bit digital output signal Dout from the quantizer 102.

Typically, the 1-bit digital output signal Dout of the delta sigma modulator is inputted to a digital filter circuit for the retrieval of a needed signal band. The delta sigma modulator composes an AD converter.

At this time, to prevent the occurrence of distortion in an output signal of the second integration circuit 111, it is necessary to operate the delta sigma modulator by setting the amplification factor $a_0$ of each of the amplifiers 120 and 121 and the feedback reference voltages ($Vr_1$ and $Vr_2$) of the DA converters 130 and 131 such that the signals inputted to the second integration circuit 111, i.e., an output of the first integration circuit 110 and an output of the second DA converter 131 are in a range under the voltage $VDD_2$.

The 1-bit digital output signal Dout as an output of the delta sigma modulator shown in FIG. 1 can be given by the following transmission function:

$$Dout \cong \frac{Ain}{2 \cdot Vr_1} + \frac{(1-Z^{-1})^2 Q \cdot 2 \cdot Vr_2}{2 \cdot Vr_2 \cdot \left[ \begin{array}{c} 1-(2-a_2)Z^{-1} + \\ (1+a2)Z^{-2} \end{array} \right] +} \quad \text{Expression 2}$$
$$2 \cdot Vr_1 \cdot a0 \cdot Z^{-2}$$

when it is assumed that the values of $Vr_2$ and $a_0$ are set to satisfy $Vr_2 = Vr_1 \cdot a_0 / a_1$, Expression 3 shown below is given:

$$Dout \cong \frac{Ain}{2 \cdot Vr_1} + \quad \text{Expression 3}$$
$$\frac{(1-Z^{-1})^2 Q \cdot 2 \cdot Vr_2}{2 \cdot Vr_2 \cdot [1-(2-a_2)Z^{-1} + (1+a_1-a_2)Z^{-2}]}$$
$$= \frac{Ain}{2 \cdot Vr_1} + \frac{(1-Z^{-1})^2 Q}{1-(2-a_2)Z^{-1} + (1+a_1-a_2)Z^{-2}}$$

The arrangement allows the settings of, e.g., $VDD_1 = 3.3$ V and $VDD_2 = 1.8$ V or 1.6 V, and allows a reduction in the power consumption of the second integration circuit 111 and the circuits subsequent thereto. In addition, noise added in the second integration circuit 111 and the circuits subsequent thereto in the delta sigma modulator is attenuated by the effect of noise shaping.

Thus, in the delta sigma modulator in the embodiment of the present invention, the amplitude of a signal in the second and subsequent-stage integration circuits in which the noise is attenuated by noise shaping is reduced, while the amplitude of a signal in the first-stage integration circuit in which the noise is not attenuated is held large. Accordingly, there is no deterioration of the SNR resulting from a reduction in the operation power source voltage of the second and subsequent-stage integration circuits. In addition, because the area of a 1.8 V transistor is generally smaller than that of a 3.3 V transistor, a reduction in circuit area can also be achieved by using the 3.3 V transistor as a transistor used in the circuit connected to the power source voltage $VDD_1$, while using the 1.8 V transistor as a transistor used in the circuit connected to the power source voltage $VDD_2$.

Next, a description will be given to a specific example of the circuit of the first embodiment of the present invention with reference to FIG. 2.

Figure 2:
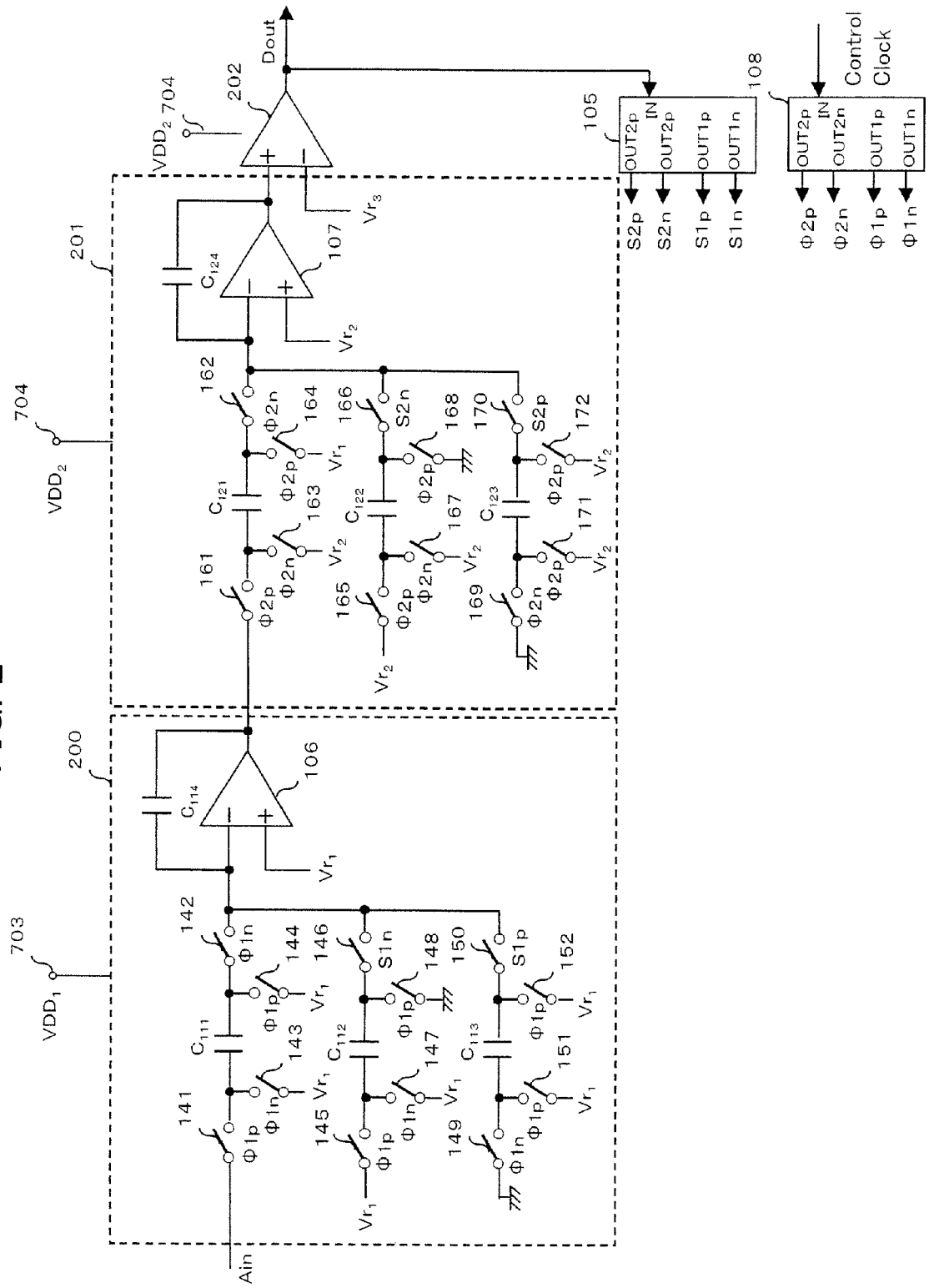
FIG. 2 is a circuit diagram showing an example of a circuit in the delta sigma modulator in the first embodiment.

The integration circuits 110 and 111, the DA converters 130 and 131, the adders/subtractors 103 and 104, and the amplifiers 120, 121, and 122 of FIG. 1 are composed of a switched capacitor circuit comprising switches 141 to 152 and 161 to 172, capacitors $C_{111}$ to $C_{114}$ and $C_{121}$ to $C_{124}$, operational amplifiers 106 and 107, and buffers 105 and 108 in FIG. 2.

Specifically, the integration circuit 110, the DA converter 130, the adder/subtractor 103, and the amplifiers 120 and 121 are composed of the switches 141 to 152, the capacitors $C_{111}$ to $C_{114}$, the operational amplifier 106, and the buffers 105 and 108 in FIG. 2.

On the other hand, the integration circuit 111, the DA converter 131, the adder/subtractor 104, and the amplifier 122 are composed of the switches 161 to 172, the capacitors $C_{121}$ to $C_{124}$, the operational amplifier 107, and the buffers 105 and 108 in FIG. 2.

$VDD_1$ and $VDD_2$ denote power source voltages supplied to the second-order delta sigma modulator, while 703 and 704 denote power source terminals. In FIG. 2, the reference numerals 200 and 201 denote circuit blocks composing the integration circuits and the DA converters.

The analog input signal Ain is integrated by the operational amplifier 106 using the first reference voltage $Vr_1$ as well as charging and discharging between the capacitors $C_{111}$ and $C_{114}$.

The feedback signal is processed as follows. The digital output signal Dout is converted by the buffer circuit 105 to the digital signals S1p and S1n. Then, by turning ON/OFF the switches 146 and 150 in accordance with the levels of the digital signals S1p and S1n, a DA conversion using the reference voltage $Vr_1$ and a zero voltage is performed. The DA converted voltage is integrated by the operational amplifier 6 using charging and discharging between the capacitors $C_{112}$ and $C_{113}$.

The amplification factor ac of the amplifier 120 of FIG. 1 corresponds to the capacitance ratio $C_{111}/C_{114}$, and the amplification factor $a_0$ of the amplifier 121 of FIG. 1 corresponds to the capacitance ratios $C_{112}/C_{114}$ and $C_{113}/C_{114}$.

Next, an output signal of the operational amplifier 106 is level-converted using the first and second reference voltages $Vr_1$ and $Vr_2$, and integrated by the operational amplifier 107 using charging and discharging between the capacitors $C_{121}$ and $C_{124}$.

The feedback signal is processed as follows. The digital output signal Dout is converted by the buffer circuit 105 to the digital signals S1p and S1n. Then, by turning ON/OFF the switches 166 and 170 in accordance with the levels of the digital signals S1p and S1n, a DA conversion using the reference voltage $Vr_1$ and a zero voltage is performed. The DA converted voltage is integrated by the operational amplifier 107 using charging and discharging between the capacitors $C_{122}$ and $C_{123}$.

In this manner, the second integration circuit 111 and the DA converter 131 are constructed. To the power source terminal of the operational amplifier 107, the second power source terminal 704 is connected. The amplification factor of the amplifier 122 shown in FIG. 1 corresponds to the capacitance ratios $C_{122}/C_{124}$ and $C_{123}/C_{124}$.

The output signal of the operational amplifier 107 is quantized by a quantizer 202 made of a comparator connected to the second power source terminal 704, and outputted as the 1-bit digital output signal Dout.

Figure 3:
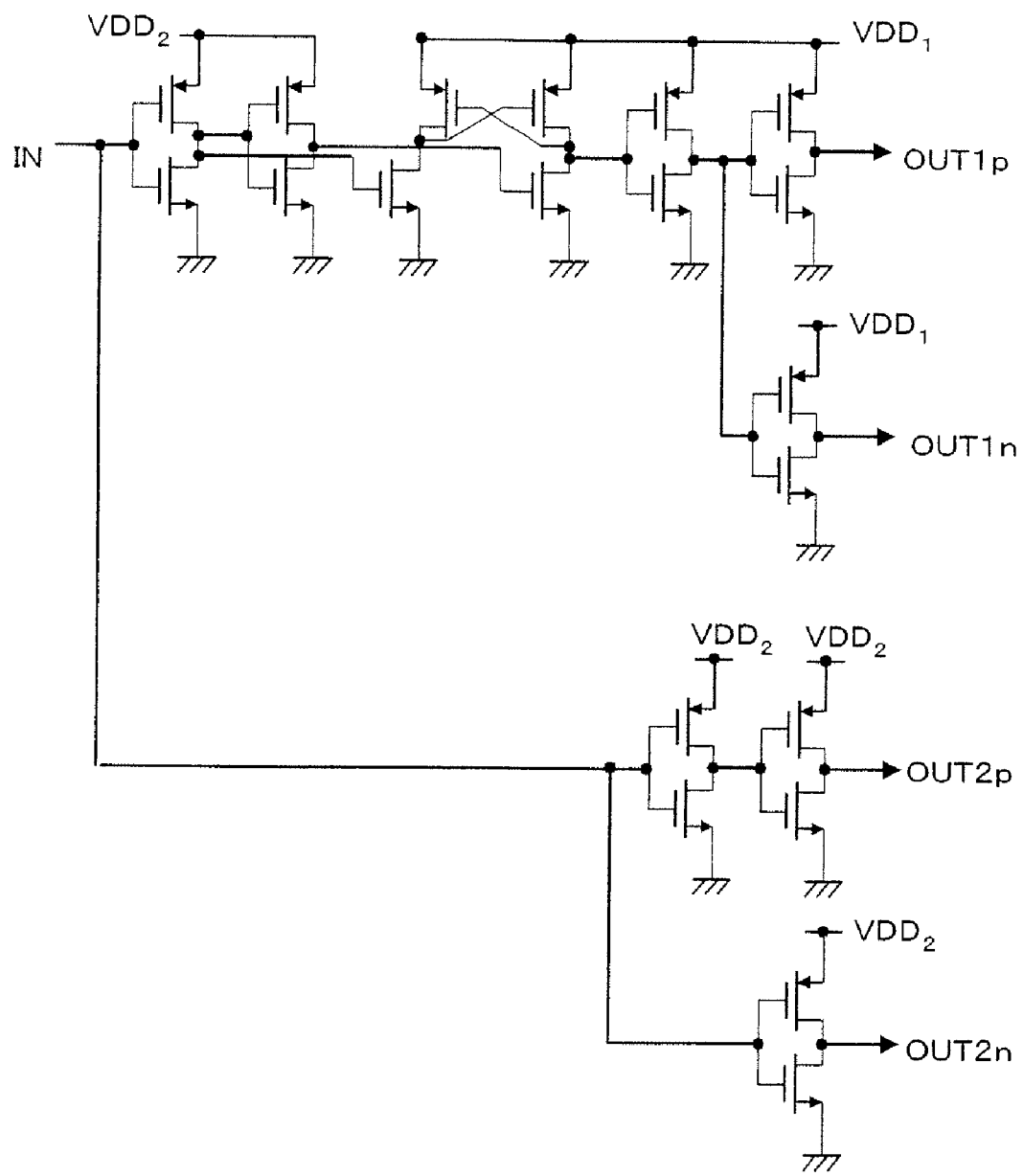
FIG. 3 is a circuit diagram showing an example of a buffer circuit.

The buffer circuits 105 and 108 are composed of a circuit shown in FIG. 3. The $VDD_2$-based digital signal inputted to a terminal IN is outputted as a $VDD_1$-based in-phase signal and a $VDD_1$-based anti-phase signal from terminals OUT1p and OUT1n, respectively, while a $VDD_2$-based in-phase signal and a $VDD_2$-based anti-phase signal are outputted from terminals OUT2p and OUT2n, respectively, to drive the respective switches.

As shown in FIGS. 4A and 4B, the reference voltage $Vr_1$ is generated by resistance division of the power source voltage $VDD_1$ or the like, and the reference voltage $Vr_2$ is generated by resistance division of the power source voltage $VDD_2$ or the like. In FIGS. 4A and 4B, 506 and 507 denote operational amplifiers.

In this manner, the delta sigma modulator shown in FIG. 1 can be implemented with the switched capacitor circuit.

Figure 5:
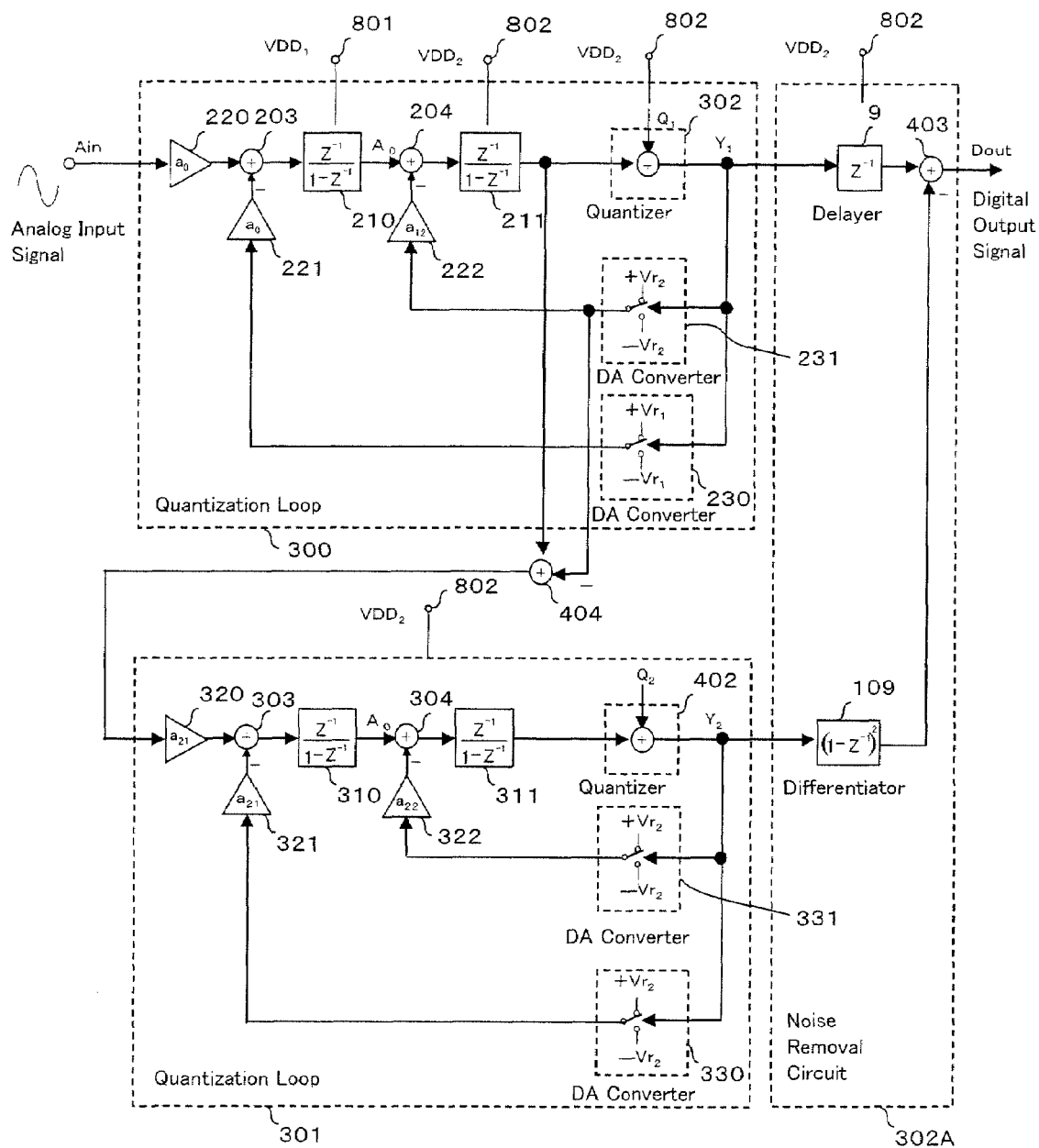
FIG. 5 is a block diagram showing a structure of a delta sigma modulator in a second embodiment of the present invention.

Next, a description will be given to a second embodiment of the present invention with reference to FIG. 5. FIG. 5 shows an example in which the delta sigma modulator of the first embodiment is applied to a cascaded delta sigma modulator. The cascaded delta sigma modulator is characterized in that it can implement a higher-order delta sigma modulation type AD converter with a larger number of stages of integration circuits. A description will be given hereinbelow to a fourth-order cascaded delta sigma modulator.

The fourth-order cascaded delta sigma modulator comprises a first second-order delta sigma modulation type quantization loop 300, a second second-order delta sigma modulation type quantization loop 301 connected in cascade to the first delta sigma modulation type quantization loop 300, and a noise removal circuit 302A for removing noise by combining the outputs of the first and second second-order delta sigma modulation type quantization loops 300 and 301. The cascaded delta sigma modulator operates with the power source voltages $VDD_1$ and $VDD_2$ supplied from power source terminals 801 and 802.

The first second-order delta sigma modulation type quantization loop 300 comprises first and second integration circuits 210 and 211, amplifiers 220 and 221 each having an amplification factor $a_0$, an amplifier 222 having an amplification factor $a_{12}$, a quantizer 302, adders/subtractors 203 and 204, and DA converters 230 and 231.

The first integration circuit 210 receives a signal obtained by subtracting, from a signal obtained by passing the analog input signal Ain through the amplifier 220, a signal obtained by passing the first feedback reference voltage (positive voltage+$Vr_1$ or negative voltage−$Vr_1$) generated from the first DA converter 230 through the amplifier 221 by means of the adder/subtractor 203, and operates with the power source voltage $VDD_1$ supplied from the first power source terminal 801.

The second integration circuit 211 receives a signal obtained by subtracting, from an output of the first integration circuit 210, a signal obtained by passing the second feedback reference voltage (positive voltage+$Vr_2$ or negative voltage−$Vr_2$) generated from the second DA converter 231 through the amplifier 222 by means of the adder/subtractor 204, and operates with the power source voltage $VDD_2$ supplied from the second power source terminal 802.

The quantizer 302 is made of, e.g., a comparator, and quantizes an output of the second integration circuit 211 to the 1-bit digital signal, and operates with the power source voltage $VDD_2$.

The first and second DA converters 230 and 231 generate the first and second feedback reference voltages mentioned above from the 1-bit digital output signal of the quantizer 302.

The second second-order delta sigma modulation type quantization loop 301 comprises third and fourth integration circuits 310 and 311, amplifiers 320 and 321 each having an amplification factor $a_{21}$, an amplifier 322 having an amplification factor $a_{22}$, a quantizer 402, adders/subtractors 303 and 304, and DA converters 330 and 331. The second second-order delta sigma modulation type quantization loop 301 receives a differential signal between an input to the quantizer 302 of the first second-order delta sigma modulation type quantization loop 300 and an output of the DA converter 231 of the first second-order delta sigma modulation type quantization loop 300, i.e., a quantization error generated by the quantizer 302 of the first second-order delta sigma modulation type quantization loop 300. The differential signal mentioned above is calculated by the adder/subtractor 404.

The third integration circuit 310 receives a signal obtained by subtracting, from a signal obtained by passing an input signal made of the quantization error generated by the quantizer 302 of the first second-order delta sigma modulation type quantization loop 300 through the amplifier 320, a signal obtained by passing the first feedback reference voltage (positive voltage+$Vr_2$ or negative voltage−$Vr_2$) generated from the third DA converter 330 through the amplifier 321 by means of the adder/subtractor 303, and operates with the power source voltage $VDD_2$.

The fourth integration circuit 311 receives a signal obtained by subtracting, from an output of the third integration circuit 310, a signal obtained by passing the second feedback reference voltage (positive voltage+$Vr_2$ or negative voltage−$Vr_2$) generated from the fourth DA converter 330 through the amplifier 322 by means of the adder/subtractor 304, and operates with the power source voltage $VDD_2$.

The quantizer 402 quantizes an output of the fourth integration circuit 311 to the 1-bit digital output signal Dout, and operates with the power source voltage $VDD_2$.

The third and fourth DA converters 330 and 331 generate the first and second feedback reference voltages each mentioned above from the 1-bit digital output signal Dout of the quantizer 402.

The noise removal circuit 302A operates with the power source voltage $VDD_2$, and provides a signal obtained by subtracting, from a signal obtained by delaying an output signal of the quantizer 302 of the first quantization loop 300 in a delayer 9, a signal obtained by differentiating an output signal of the quantizer of the second second-order delta sigma modulation type quantization loop 301 in a differentiator 109 by means of the adder/subtractor 403 as an output signal of the cascaded delta sigma modulator.

Respective outputs $Y_1$ and $Y_2$ of the second-order delta sigma modulation type quantization loops 300 and 301 can be given by the following transmission functions:

$$Y_1 \cong \frac{Ain}{2 \cdot Vr_1} + \frac{(1-Z^{-1})Q_1 \cdot 2 \cdot Vr_2}{2 \cdot Vr_2 \cdot \left[\begin{array}{c} 1-(2-a_2)Z^{-1} + \\ (1+a_1-a_2)Z^{-2} \end{array}\right] +} \quad \text{Expression 4}$$
$$2 \cdot Vr_1 \cdot a0 \cdot Z^{-2}$$

$$Y_2 \cong \frac{Q_1 \cdot 2 \cdot Vr_2}{2 \cdot Vr_2} + \quad \text{Expression 5}$$
$$\frac{(1-Z^{-1})Q_2 \cdot 2 \cdot Vr_2}{2 \cdot Vr_2 \cdot [1-(2-a_{22})Z^{-1} + (1+a_{21}-a_{22})Z^{-2}]}$$
$$= Q_1 + \frac{(1-Z^{-1})Q_2}{[1-(2-a_{22})Z^{-1} + (1+a_{21}-a_{22})Z^{-2}]}$$

when it is assumed that the values of $Vr_2$ and $a_0$ are set to satisfy $Vr_2 = Vr_1 \cdot a_0/a_{11}$, as in the case with Expression 3, Expression 6 shown below is given:

$$Y_1 \cong \frac{Ain}{2 \cdot Vr_1} + \frac{(1-Z^{-1})Q_1}{\left[\begin{array}{c} 1-(2-a_{12})Z^{-1} + \\ (1+a_{11}-a_{12})Z^{-2} \end{array}\right]} \quad \text{Expression 6}$$

Accordingly, the 1-bit digital output signal Dout as the output of the cascaded delta sigma modulator is given by Expression 7 shown below:

$$Dout = \frac{Ain}{2 \cdot Vr_1} + \frac{(1-Z^{-1})^4 Q_2}{1-(2-a_{22})Z^{-1} +} \quad \text{Expression 7}$$
$$(1+a_{11}-a_{22})Z^{-2}$$

From the foregoing result, it can be seen that, by comprising the first power source terminal 801 connected to the first integration circuit 210 and the second power source terminal 802 connected to the second integration circuit 211 in the same manner as in the first embodiment, the settings of, e.g., $VDD_1$=3.3 V and $VDD_2$=1.8 V or 1.6 V are allowed, and a delta sigma modulator which allows a reduction in power consumption without degrading the SNR can be implemented.

The cascaded delta sigma modulator shown in the second embodiment of the present invention can be constructed to have a three or more stage configuration. Although the delta sigma modulation type quantization loop in each of the stages is composed of two stages of integration circuits, it can be composed of one stage of an integration circuit or three or more stages of integration circuits. In addition, it is not necessary for all the quantization loops to have the same numbers of stages of integration circuits.

Figure 6:
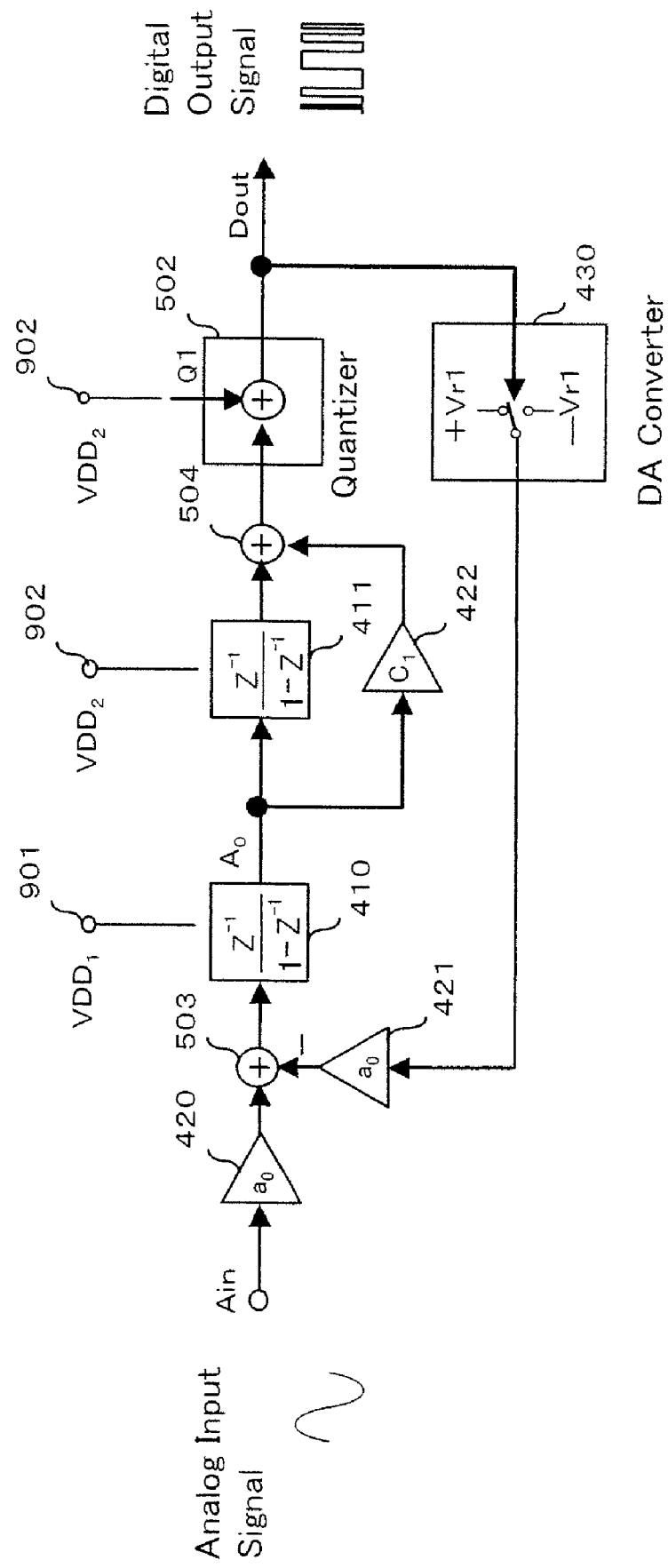
FIG. 6 is a block diagram showing a structure of a delta sigma modulator in a third embodiment of the present invention.

FIG. 6 shows an example of a feed forward delta sigma modulator as a third embodiment of the present invention.

The delta sigma modulator of FIG. 6 comprises first and second integration circuits 410 and 411, amplifiers 420 and 421 each having the amplification factor $a_0$, an amplifier 422 having an amplification factor $C_1$, adders/subtractors 503 and 504, a quantizer 502, and a DA converter 430.

The first integration circuit 410 receives a signal obtained by subtracting, from a signal obtained by passing the analog input signal Ain through the amplifier 420, a signal obtained by passing the feedback reference voltage (positive voltage+$Vr_1$ or negative voltage−$Vr_1$) generated from the DA converter 430 through the amplifier 421 by means of the adder/subtractor 403, and operates with the power source voltage $VDD_1$ supplied from a first power source terminal 901.

The second integration circuit 411 receives an output of the first integration circuit 410, and operates with the power source voltage $VDD_2$ supplied from a second power source terminal 902.

The quantizer 502 quantizes a signal obtained by adding up an output of the second integration circuit 411 and a signal obtained bypassing the output of the first integration circuit 410 through the amplifier 422 by means of the adder 404 to the 1-bit digital output signal Dout, and operates with the power source voltage $VDD_2$.

The DA converter 430 generates the feedback reference voltage mentioned above from the 1-bit digital output signal Dout of the quantizer 502, and operates with the power source voltage $VDD_2$.

At this time, to prevent the occurrence of distortion in the output signal, it is necessary to operate the delta sigma modulator by setting the amplification factor $a_0$ of each of the amplifiers 420 and 421 and the feedback reference voltage ($Vr_1$) of the DA converter 430 such that the signal inputted to the second integration circuit 411 and the adder 404, i.e., the output of the first integration circuit 410 is in a range under the power source voltage $VDD_2$, in the same manner as in the first embodiment.

The 1-bit digital output signal Dout as an output of the delta sigma modulator shown in FIG. 6 can be given by the following transmission function:

$$Dout \cong \frac{Ain}{2 \cdot Vr_1} + \frac{(1-Z^{-1})^2 Q \cdot 2 \cdot Vr_2}{2 \cdot Vr_2[1-2Z^{-1}+Z^{-2}]+} \qquad \text{Expression 8}$$
$$2 \cdot Vr_1 \cdot a_0[c_1 \cdot Z^{-1} + (1-c_1)Z^{-2}]$$

when it is assumed that the values of $Vr_2$ and $a_0$ are set to satisfy $Vr_2 = Vr_1 \cdot a_0/a_1$, Expression 9 shown below is given:

$$Dout \cong \frac{Ain}{2 \cdot Vr_1} + \qquad \text{Expression 9}$$
$$\frac{(1-Z^{-1})Q_2 \cdot 2 \cdot Vr_2}{2 \cdot Vr_2 \cdot [1-(2-a_1 \cdot c_1)Z^{-1}+(1+a_1-a_1 \cdot c_1)Z^{-2}]}$$
$$= \frac{Ain}{2 \cdot Vr_1} + \frac{(1-Z^{-1})^2 Q}{1-(2-a_1 \cdot c_1)Z^{-1}+(1+a_1-a_1 \cdot c_1)Z^{-2}}$$

In the arrangement, by comprising the first power source terminal 901 connected to the first integration circuit 410 and the second power source terminal 902 connected to the second integration circuit 411 in the same manner as in the first embodiment, the settings of, e.g., $Vdd_1=3.3$ V and $Vdd_2=1.8$ V or 1.6 V are allowed, and a delta sigma modulator which allows a reduction in power consumption without degrading the SNR can be implemented.

The feed forward delta sigma modulator shown in the third embodiment of the present invention can also compose the cascaded delta sigma modulator as shown in FIG. 5.

Next, a description will be given to a specific example of a circuit in the third embodiment of the present invention with reference to FIG. 7.

Figure 7:
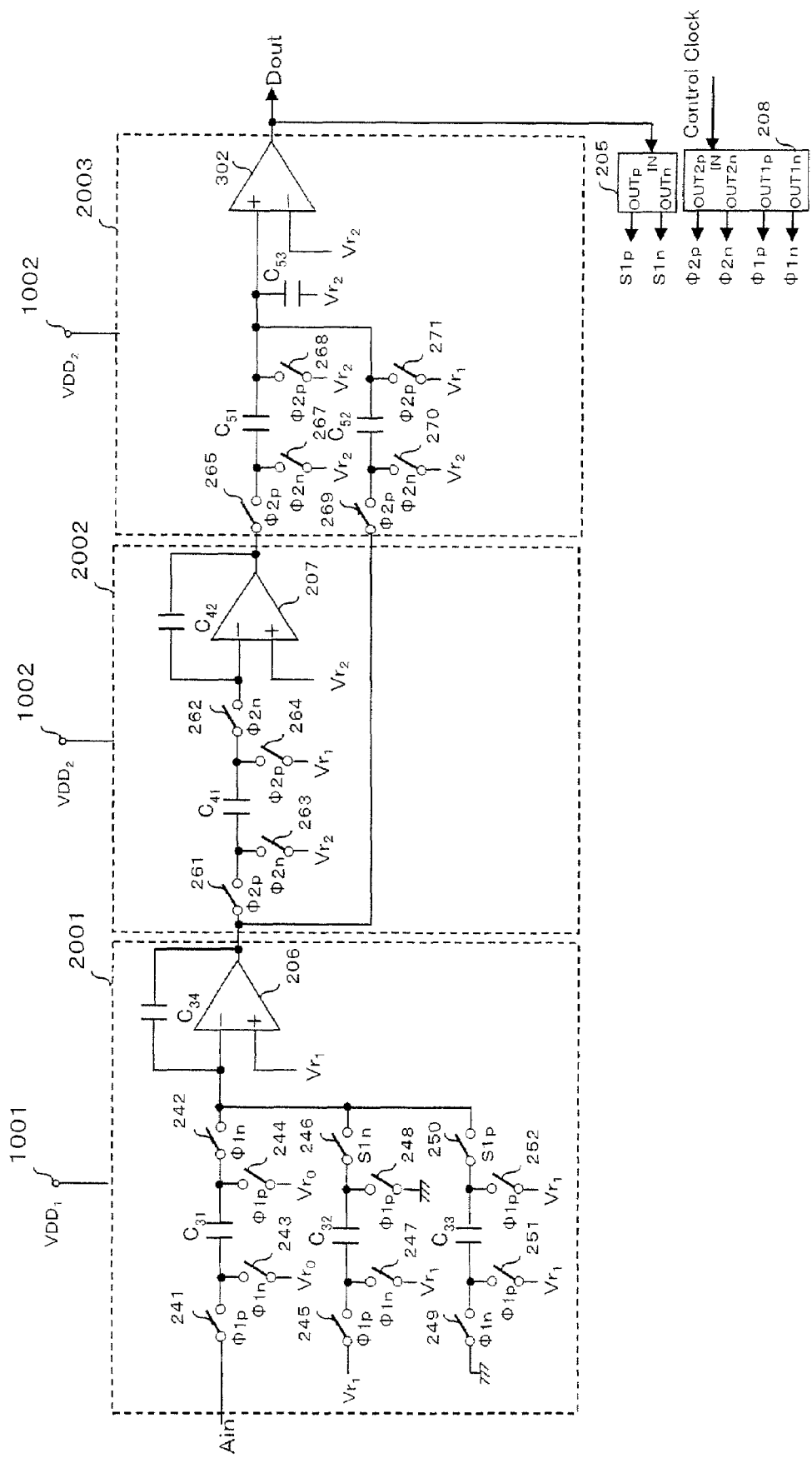
FIG. 7 is a circuit diagram showing an example of a circuit in the delta sigma modulator in the third embodiment.

The integration circuits 410 and 411, the DA converter 430, the adders/subtractors 503 and 504, and the amplifiers 420, 421, and 422 of FIG. 6 are composed of a switched capacitor circuit comprising switches 241 to 252, 261 to 271, capacitors $C_{31}$ to $C_{34}$, $C_{41}$, $C_{42}$, and $C_{51}$ to $C_{53}$, and operational amplifiers 206 and 207, as shown in FIG. 7.

Specifically, the integration circuit 410, the DA converter 430, the adder/subtractor 503, and the amplifiers 420 and 421 are composed of the switches 241 to 252, the capacitors $C_{31}$ to $C_{34}$, and the operational amplifier 206, as shown in FIG. 7.

On the other hand, the integration circuit 411 is composed of the switches 261 to 271, the capacitors $C_{41}$ and $C_{42}$, and the operational amplifier 207.

The adder/subtractor 504, the amplifier 422, and the quantizer 502 are composed of the switches 261 to 271, the capacitors $C_{51}$ to $C_{53}$, and a comparator (operational amplifier) 302.

The reference numeral 2001 denotes a circuit block composing the integration circuit and the DA converter. The reference numeral 2002 denotes a circuit block composing the integration circuit. The reference numeral 2003 denotes a circuit block composing the quantizer and the feed forward circuit.

The analog input signal Ain is integrated by the operational amplifier 206 using the first reference voltage $Vr_1$ as well as charging and discharging between the capacitors $C_{31}$ and $C_{34}$.

The feedback signal is processed as follows. The digital output signal Dout is converted by a buffer circuit 205 to the digital signals S1p and S1n. Then, by turning ON/OFF the switches 246 and 250 in accordance with the levels of the digital signals S1p and S1n, a DA conversion using the reference voltage $Vr_1$ and a zero voltage is performed. The DA converted voltage is integrated by the operational amplifier 206 using charging and discharging between the capacitors $C_{32}$ and $C_{33}$.

In this manner, the first integration circuit 410 and the DA converter 430 shown in FIG. 6 are constructed. The amplification factor of the amplifier 420 shown in FIG. 7 corresponds to the capacitance ratio $C_{31}/C_{34}$, and the amplification factor of the amplifier 421 shown in FIG. 7 corresponds to the capacitance ratios $C_{32}/C_{34}$, and $C_{33}/C_{34}$. The switches 241 to 252, and the operational amplifier 206 operate with the power source voltage $VDD_1$ supplied from a first power source terminal 1001.

Next, an output signal of the operational amplifier 206 is integrated by the operational amplifier 207 using the first and second reference voltages $Vr_1$ and $Vr_2$ as well as charging and discharging between the capacitors $C_{41}$ and $C_{42}$.

In this manner, the second integration circuit 411 is constructed. The switches 261 to 264 and the operational amplifier 207 operate with the power source voltage $VDD_2$.

Next, the output signals of the operational amplifiers 206 and 207 are added up using the first and second reference voltages $Vr_1$ and $Vr_2$ as well as charging and discharging between the capacitors $C_{51}$, $C_{52}$, and $C_{53}$. The amplification factor of the amplifier 422 shown in FIG. 6 corresponds to the capacitance ratio $C_{52}/C_{53}$. The switches 265 to 271 operate with the power source voltage $VDD_2$.

Figure 8:
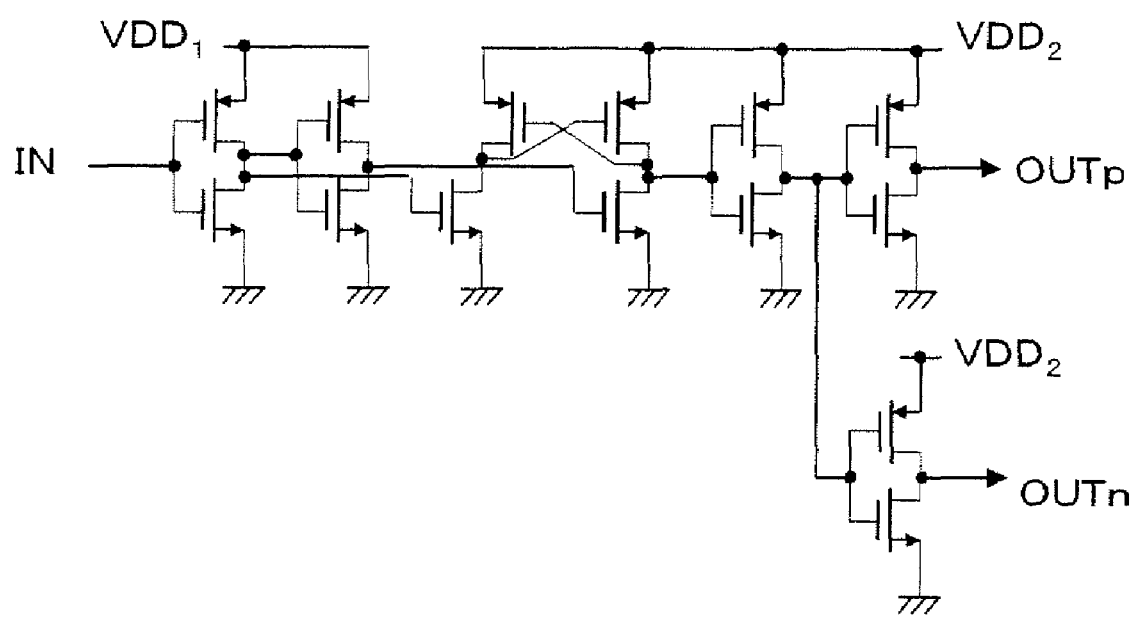
FIG. 8 is a circuit diagram showing an example of a buffer circuit.

The buffer circuit is composed of a circuit shown in FIG. 8. The $VDD_2$-based digital signal inputted to the terminal IN is outputted as a $VDD_1$-based in-phase signal and a $VDD_1$-based anti-phase signal from the terminals OUTp and OUTn.

In this manner, the delta sigma modulator shown in FIG. 6 can be implemented by the switched capacitor circuit.

Figure 9:
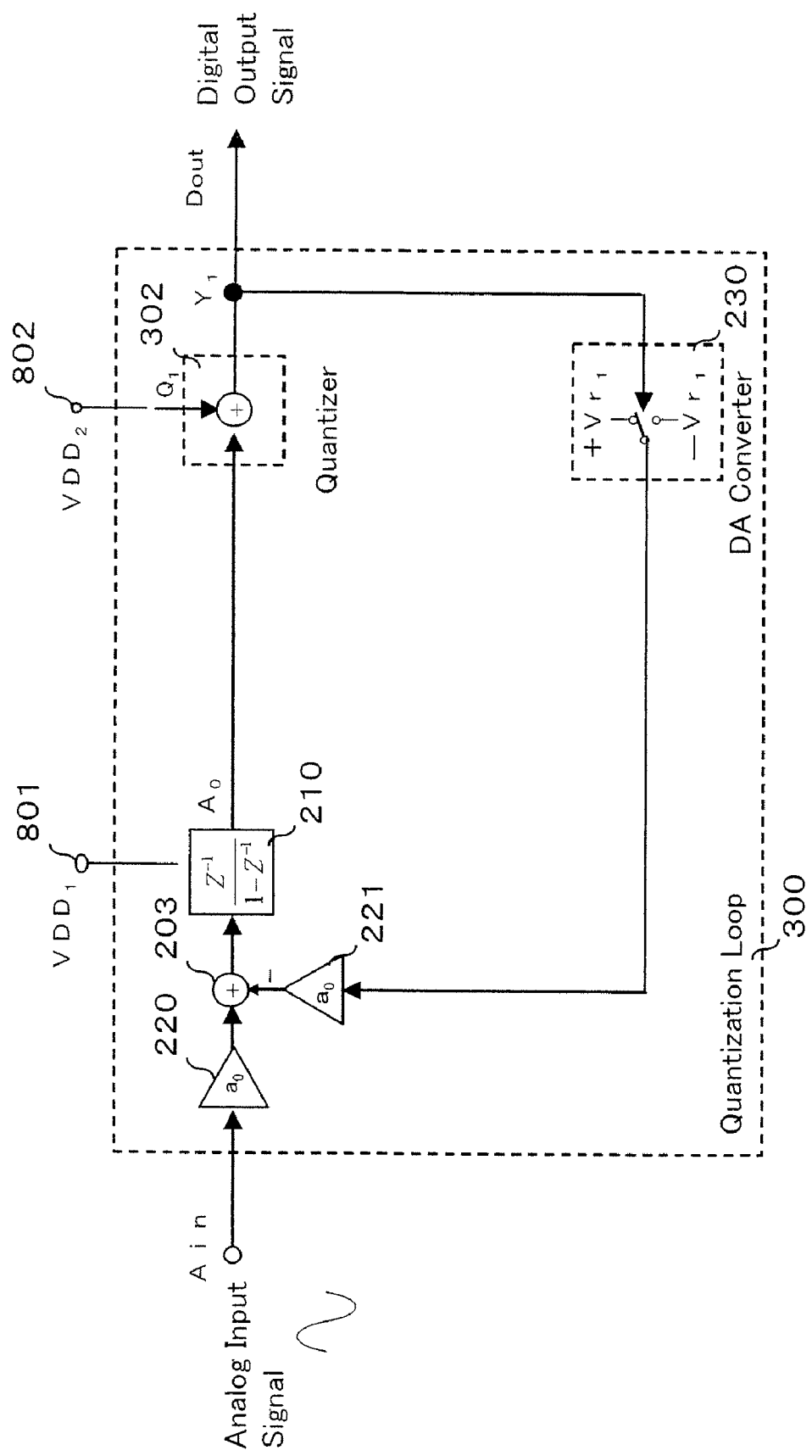
FIG. 9 is a circuit diagram showing an example of a circuit in a delta sigma modulator in a fourth embodiment of the present invention.

FIG. 9 shows a structure of a single-loop first-order delta sigma modulator of a fourth embodiment of the present invention. The delta sigma modulator 300 comprises the integration circuit 210, the quantizer 302, and the DA converter 230.

The integration circuit 210 receives a signal obtained by subtracting, from a signal obtained by passing the analog input signal Ain through the amplifier 220, a signal obtained by passing the first feedback reference voltage (positive voltage+$Vr_1$ or negative voltage−$Vr_1$) generated from the DA converter 230 through the amplifier 221 by means of the adder/subtractor 203, and operates with the power source voltage ($VDD_1$) supplied from the first power source terminal 801. The quantizer 302 quantizes an output Ao of the first integration circuit 210 to the 1-bit digital signal (Dout), and operates with the power source voltage $VDD_2$. The DA converter 230 generates the first feedback reference voltage mentioned above from a digital output of the quantizer 302.

At this time, to prevent the occurrence of distortion in an output signal of the quantizer 302, it is necessary to operate the delta sigma modulator by setting the amplification factor $a_0$ of each of the amplifiers 220 and 221 and the feedback reference voltage ($Vr_1$) of the DA converter 230 such that the signal inputted to the quantizer 302, i.e., the output of the integration circuit 210 is in a range under the voltage $VDD_2$.

The output Dout of the delta sigma modulator shown in FIG. 9 can be given by the following transmission function:

$$Dout \cong \frac{Ain}{2 \cdot Vr_1} + \frac{(1-Z^{-1})Q \cdot 2 \cdot Vr_2}{2 \cdot Vr_1 \cdot a0 \cdot Z^{-1}} \qquad \text{Expression 10}$$

The arrangement allows the settings of, e.g., $Vdd_1$=3.3 V and $Vdd_2$=1.8 V or 1.6 V, and allows a reduction in the power consumption of the quantizer 302 and the circuits subsequent thereto. Thus, in the delta sigma modulator according to the present invention, the amplitude of a signal in the quantizer 302 in which noise is attenuated is reduced, while the amplitude of a signal in the first-stage integration circuit 210 in which the noise is not attenuated is maintained. Accordingly, there is no deterioration of the SNR resulting from a reduction in the operation power source voltage. In addition, because the area of a 1.8 V transistor is generally smaller than that of a 3.3 V transistor, a reduction in circuit area can also be achieved by using the 3.3 V transistor with a high operation power source voltage as a transistor used in the circuit connected to the power source voltage $VDD_1$, while using the 1.8 V transistor as a transistor used in the circuit connected to the power source voltage $VDD_2$.

Figure 10:
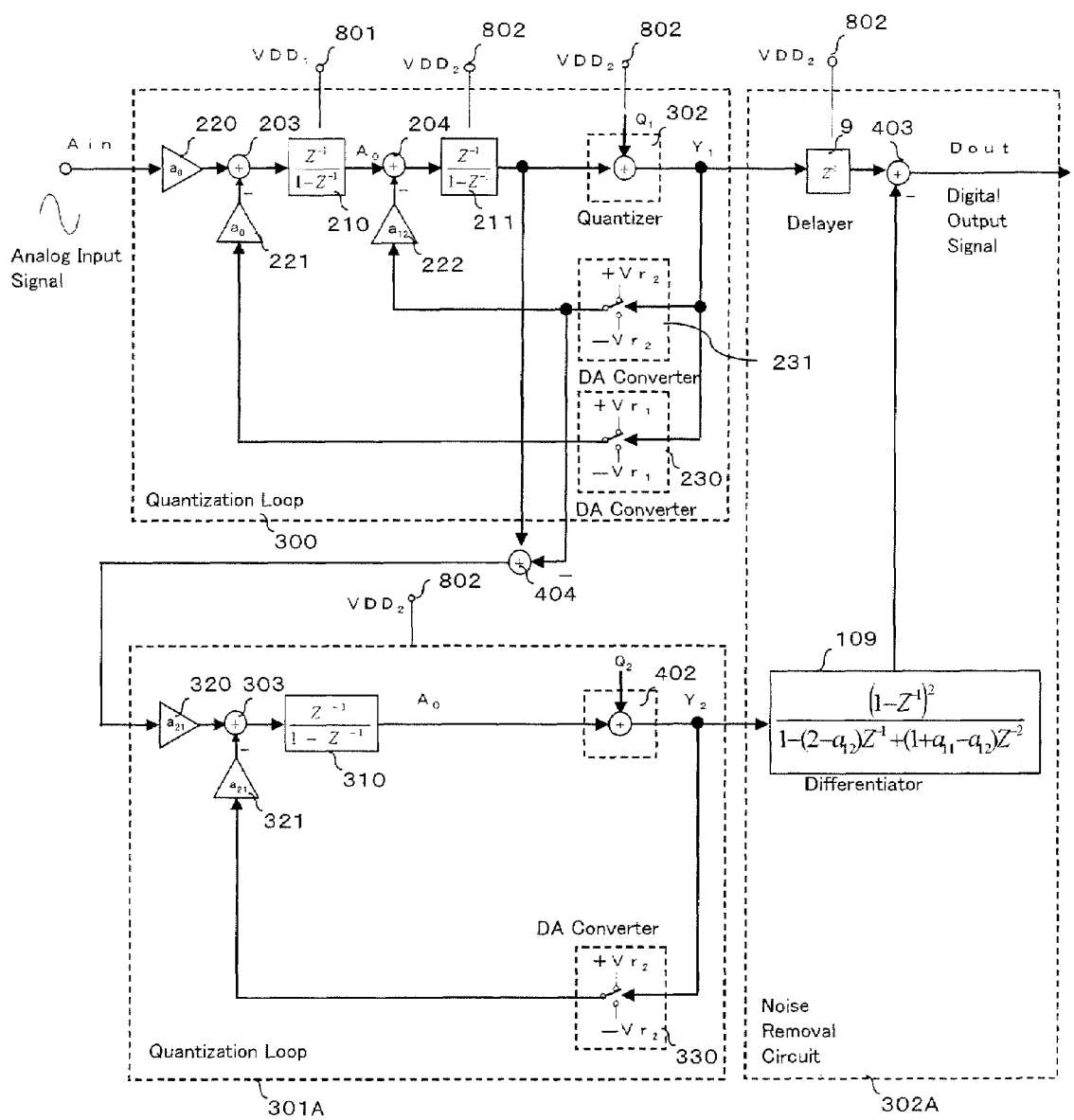
FIG. 10 is a circuit diagram showing an example of a circuit in a delta sigma modulator in a fifth embodiment of the present invention.

Next, a delta sigma modulator according to a fifth embodiment of the present invention will be shown using FIG. 10. FIG. 10 shows an example in which the first embodiment is applied to a cascaded delta sigma modulator. The cascaded delta sigma modulator is characterized in that it can implement a higher-order delta sigma modulation type AD converter with a larger number of stages of integration circuits. A description will be given hereinbelow to a third-order cascaded delta sigma modulator.

The third-order cascaded delta sigma modulator comprises the second-order delta sigma modulation type quantization loop 300, a first-order delta sigma modulation type quantization loop 301A connected in cascade to the second-order delta sigma modulation type quantization loop 300, and the noise removal circuit 302A for removing noise by combining the outputs of the second-order delta sigma modulation type quantization loop 300 and the first-order delta sigma modulation type quantization loop 301A.

The second-order delta sigma modulation type quantization loop 300 comprises the first and second integration circuits 210 and 211, the quantizer 302, and the first and second DA converters 230 and 231.

The first integration circuit 210 receives a signal obtained by subtracting, from a signal obtained by passing the analog input signal Ain through the amplifier 220, a signal obtained by passing the first feedback reference voltage (positive voltage+$Vr_1$ or negative voltage−$Vr_1$) generated from the first DA converter 230 through the amplifier 221 by means of the adder/subtractor 203, and operates with the power source voltage ($VDD_1$) supplied from the first power source terminal 801.

The second integration circuit 211 receives a signal obtained by subtracting, from an output of the first integration circuit 210, a signal obtained by passing the second feedback reference voltage (positive voltage+$Vr_2$ or negative voltage−$Vr_2$) generated from the second DA converter 231 through the amplifier 222 by means of the adder/subtractor 204, and operates with the power source voltage ($VDD_2$) supplied from the second power source terminal.

The quantizer 302 quantizes an output of the second integration circuit 211 to the 1-bit digital signal, and operates with the voltage $VDD_2$.

The first DA converter 230 generates the first feedback reference voltage mentioned above from a digital output of the quantizer 302.

The second DA converter 231 generates the second feedback reference voltage mentioned above from the digital output of the quantizer 302.

The first-order delta sigma modulation type quantization loop 301A comprises the third integration circuit 310, the second quantizer 402, and the third DA converter 330.

The first-order delta sigma modulation type quantization loop 301A receives a differential signal between an input to the quantizer 302 of the second-order delta sigma modulation type quantization loop 300 and an output of the DA converter 231 of the second-order delta sigma modulation type quantization loop 300, i.e., a quantization error generated by the quantizer 302 of the second-order delta sigma modulation type quantization loop 300.

The third integration circuit 310 receives a signal obtained by subtracting, from a signal obtained by passing the input signal mentioned above through the amplifier 320, a signal obtained by passing the second feedback reference voltage (positive voltage+$Vr_2$ or negative voltage−$Vr_2$) generated from the third DA converter 330 through the amplifier 321 by means of the adder/subtractor 303, and operates with the voltage $VDD_2$.

The quantizer 402 quantizes an output of the third integration circuit 310 to the 1-bit digital signal, and operates with the voltage $VDD_2$.

The third DA converter 330 comprises the third DA converter 331 for generating the second feedback reference voltage mentioned above from the digital output of the quantizer 402.

The noise removal circuit operates with the voltage $VDD_2$, and provides a signal obtained by subtracting, from a signal obtained by delaying the output signal of the quantizer 302 of the second-order delta sigma modulation type quantization loop 300 in the delayer 9, a signal obtained by differentiating an output signal of the quantizer 402 of the first-order delta sigma modulation type quantization loop 301A in the differentiator 109 by means of the adder/subtractor 403 as an output signal of the cascaded delta sigma modulator.

Respective outputs $Y_1$ and $Y_2$ of the second-order delta sigma modulation type quantization loop 300 and the first-order delta sigma modulation type quantization loop 301A can be respectively given by the following transmission functions:

$$Y_1 \cong \frac{Ain}{2 \cdot Vr_1} + \frac{(1-Z^{-1})^2 Q_1 \cdot 2 \cdot Vr_2}{2 \cdot Vr_2 \cdot \begin{bmatrix} 1-(2-a_{12})Z^{-1} + \\ (1-a_{12})Z^{-2} \end{bmatrix} +} \quad \text{Expression 11}$$
$$2 \cdot Vr_1 \cdot a_0 \cdot Z^{-2}$$

$$Y_2 \cong \frac{Q_1 \cdot 2 \cdot Vr_2}{2 \cdot Vr_2} + \frac{(1-Z^{-1})Q_2 \cdot 2 \cdot Vr_2}{2 \cdot Vr_2 \cdot a21 \cdot Z^{-1}} \quad \text{Expression 12}$$
$$= Q_1 + \frac{(1-Z^{-1})Q_2}{2 \cdot Vr2 \cdot a21 \cdot Z^{-1}}$$

when it is assumed that the values of $Vr_2$ and $a_0$ are set to satisfy $Vr_2=Vr_1 \cdot a_0/a_{11}$, as in the case with Expression 3, Expression 13 shown below is given:

$$Y_1 \cong \frac{Ain}{2 \cdot Vr_1} + \frac{(1-Z^{-1})^2 Q_1}{\begin{bmatrix} 1-(2-a_{12})Z^{-1} + \\ (1+a_{11}-a_{12})Z^{-2} \end{bmatrix}} \quad \text{Expression 13}$$

Accordingly, the output Dout of the cascaded delta sigma modulator can be given by Expression 14 shown below:

$$Dout = \frac{Ain}{2 \cdot Vr_1} + \frac{(1-Z^{-1})^3 Q_2}{2 \cdot Vr2 \cdot a21 \cdot} \quad \text{Expression 14}$$
$$Z^{-1} \begin{bmatrix} 1-(2-a_{12})Z^{-1} + \\ (1+a_{11}-a_{12})Z^{-2} \end{bmatrix}$$

From the foregoing result, it can be seen that, by comprising the first power source terminal 801 connected to the first integration circuit 210 and the second power source terminal 802 connected to the second integration circuit 211 and the third integration circuit 310 in the same manner as in the first embodiment, the settings of, e.g., $VDD_1$=3.3 V and $VDD_2$=1.8 V or 1.6 V are allowed, and a delta sigma modulator which allows a reduction in power consumption without degrading the SNR can be implemented.

The cascaded delta sigma modulator shown in the fifth embodiment of the present invention can be constructed to have a three or more stage configuration.

Figure 11:
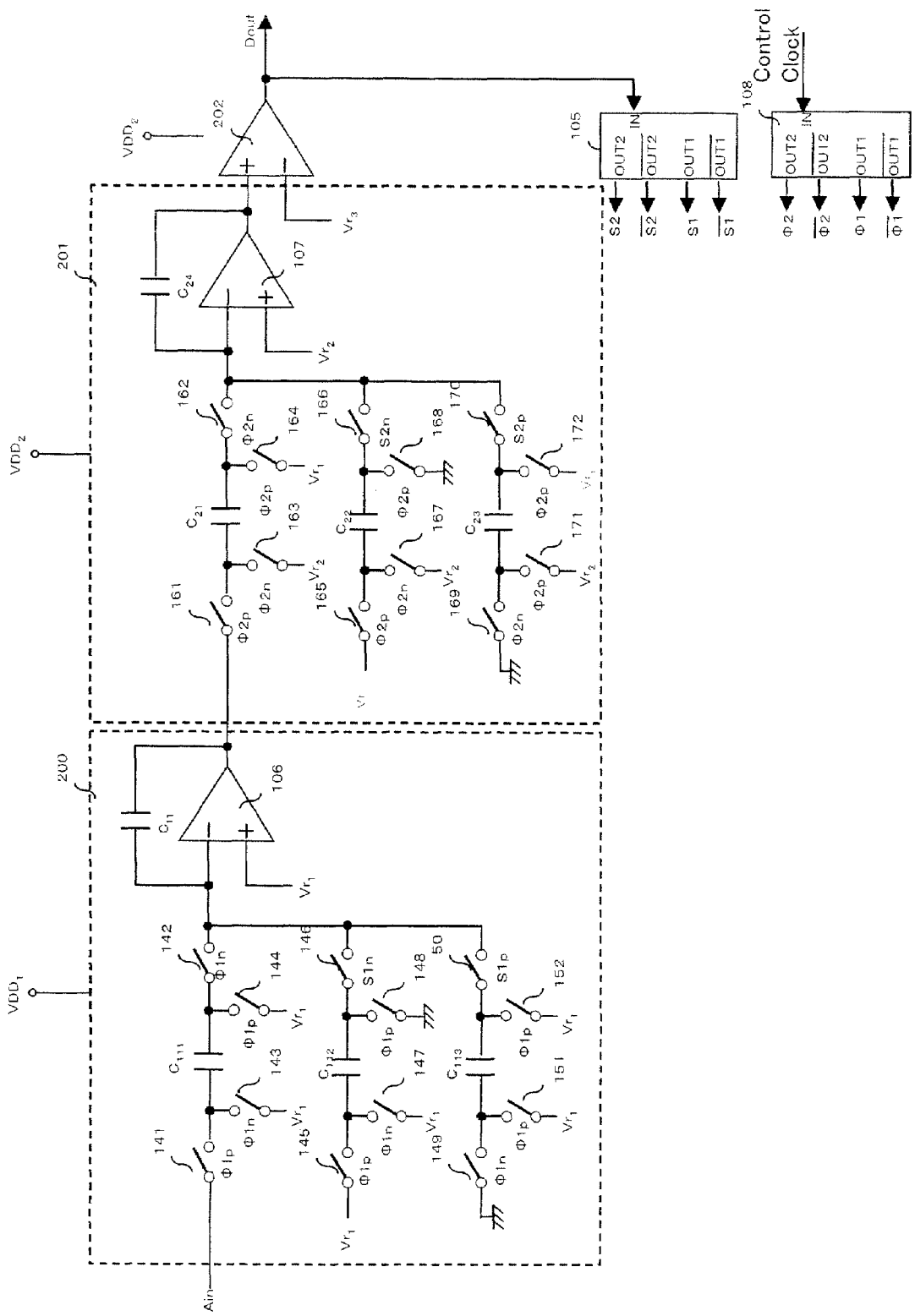
FIG. 11 is a circuit diagram showing an example of a circuit in a delta sigma modulator in a sixth embodiment of the present invention.

Next, a delta sigma modulator according to a sixth embodiment of the present invention will be shown using FIG. 11. The circuit is obtained by partly changing a voltage applied to the delta sigma modulator of FIG. 2. Specifically, although the first feedback reference voltage is generated based on the voltage $Vr_1$ and the second feedback reference voltage is generated based on the voltage $Vr_2$ in the delta sigma modulator of FIG. 1, both of the first and second feedback voltages may be generated based on the voltage $Vr_1$. In this case, the same effect as obtained in the first embodiment can also be obtained.

The circuit structure when both of the first and second feedback reference voltages are generated based on the voltage $Vr_1$ in the manner mentioned above is shown in FIG. 11. The difference between FIG. 11 and FIG. 2 is that the voltage applied to one end of each of the switches 165 and 172 is changed from the voltage $Vr_2$ to the voltage $Vr_1$.

However, even though both of the first and second feedback reference voltages are generated based on the voltage $Vr_1$, the voltage $Vr_2$ does not become unnecessary. The reason for this is that the voltage $Vr_2$ is needed to determine the operation point of the second integration circuit 201, so that the voltage $Vr_2$ is applied with respect thereto, in the same manner as in FIG. 2.

Next, a description will be given to a variation of a method of applying the power source voltage as a seventh embodiment of the present invention with reference to FIGS. 12A to 12D.

Figure 12A:
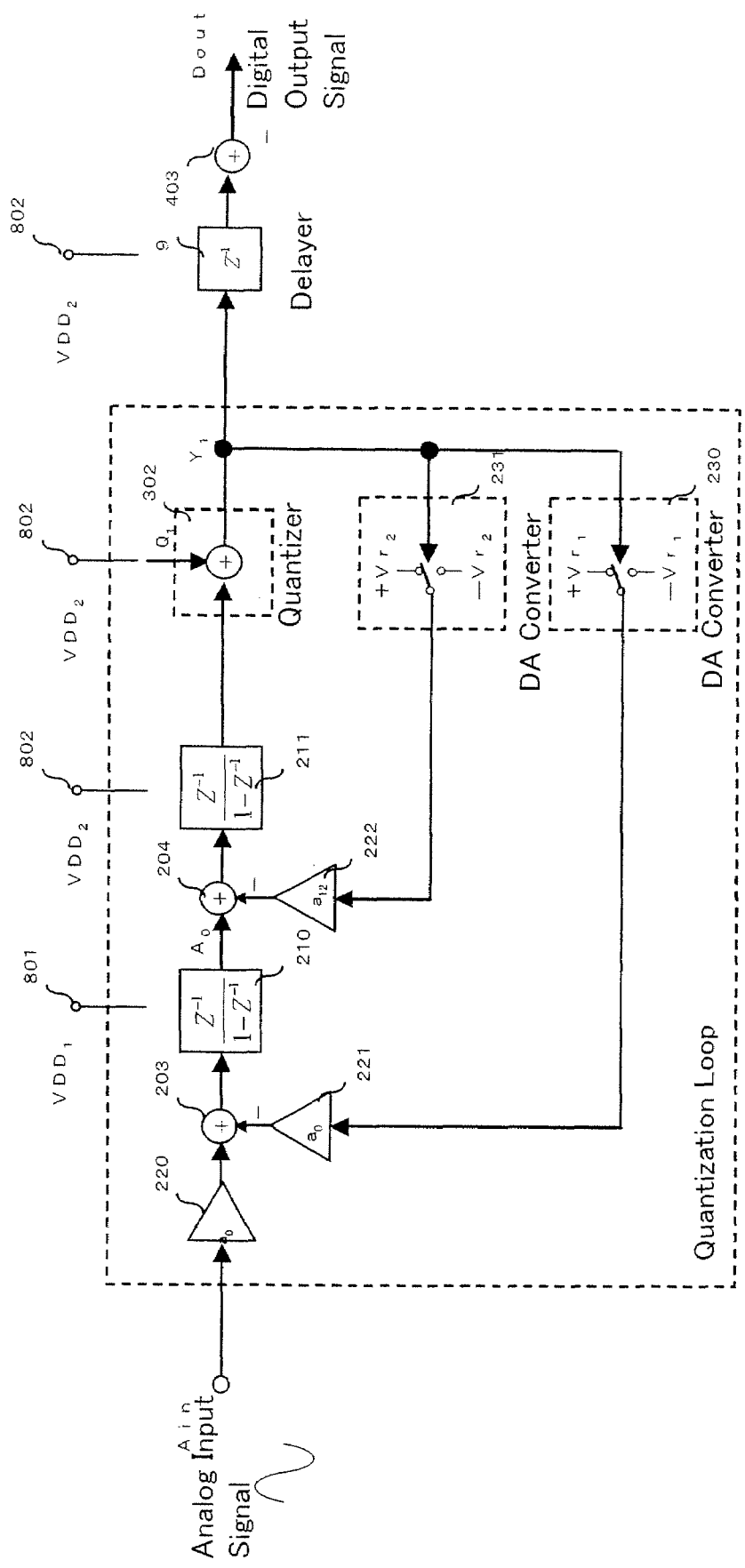
FIGS. 12A to 12D are circuit diagrams each showing an example of a circuit in a delta sigma modulator in a seventh embodiment of the present invention.
Figure 12B:
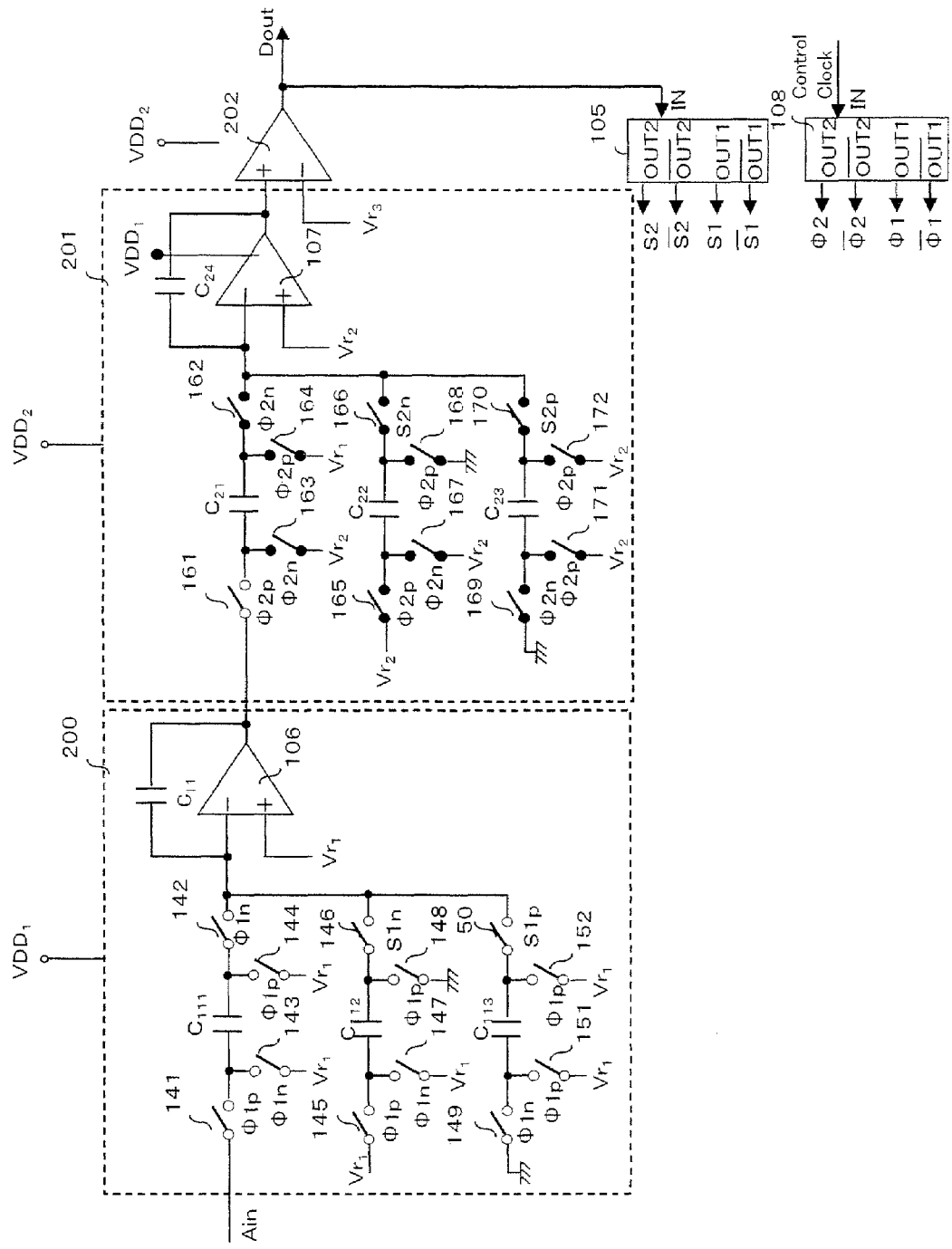
Figure 12C:
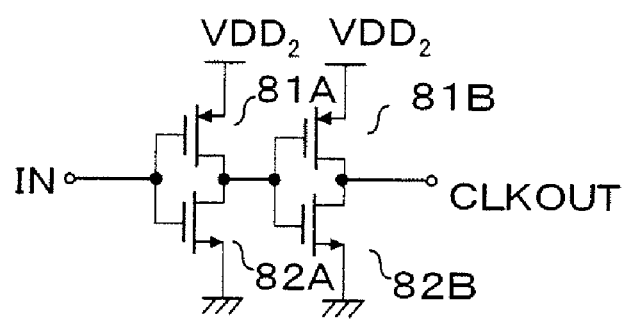
Figure 12D:
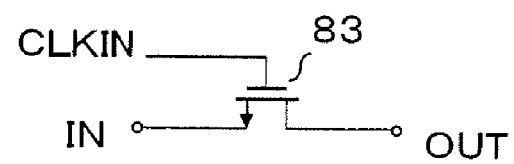
Figure 13:
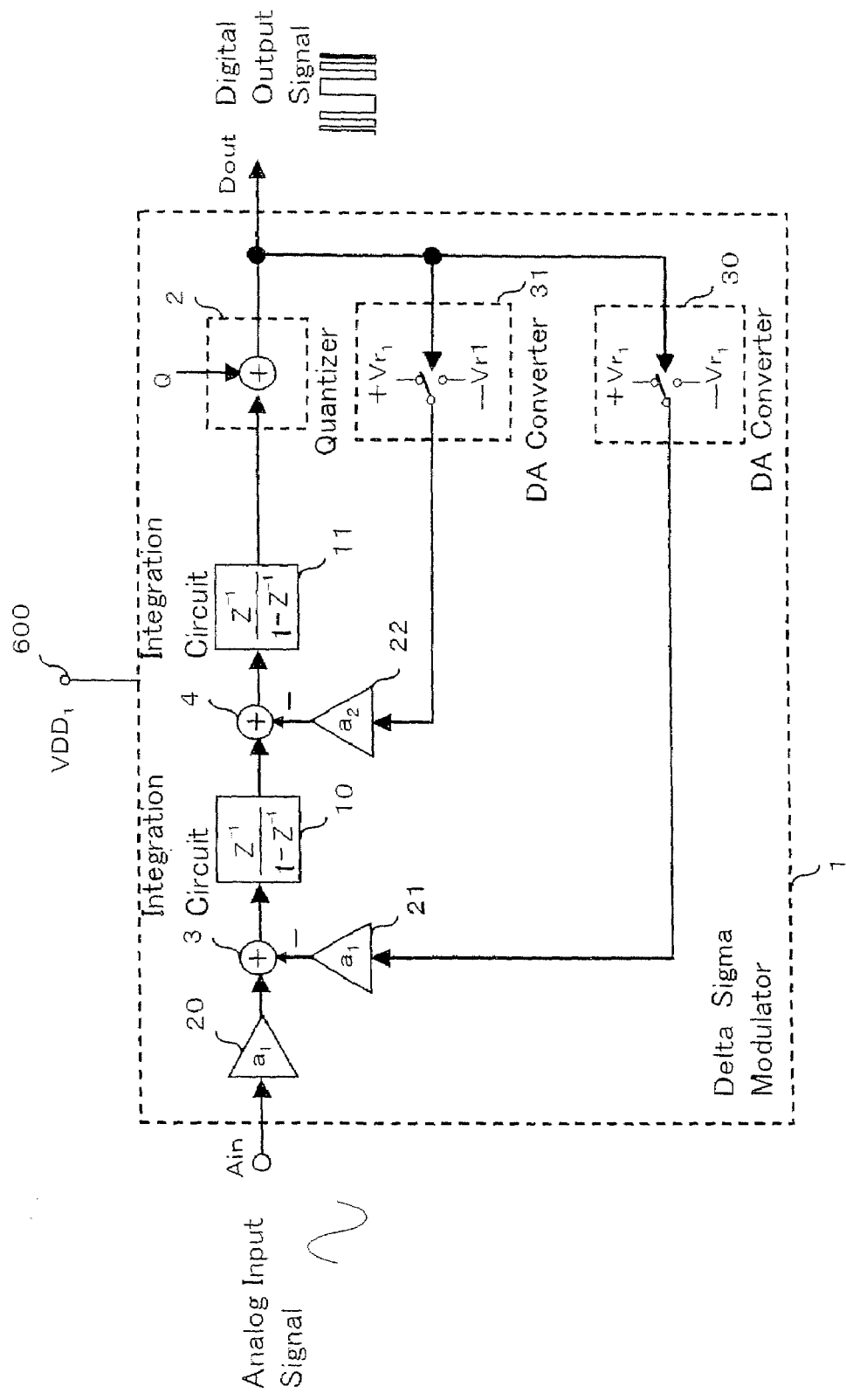
FIG. 13 is a block diagram showing a structure of a conventional delta sigma modulator.
Figure 14:
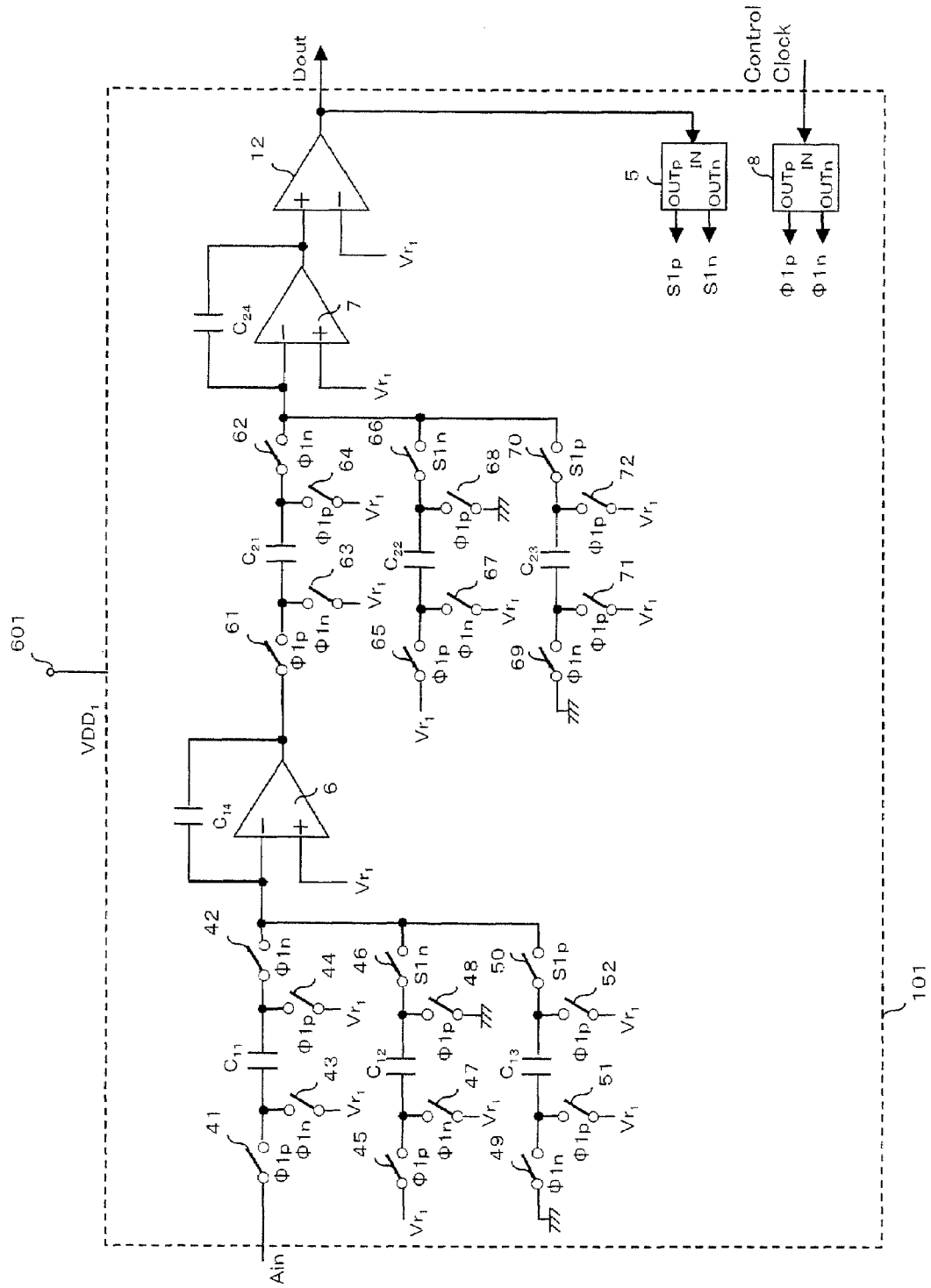
FIG. 14 is a circuit diagram showing an example of a circuit in the conventional delta sigma modulator.
Figure 15:
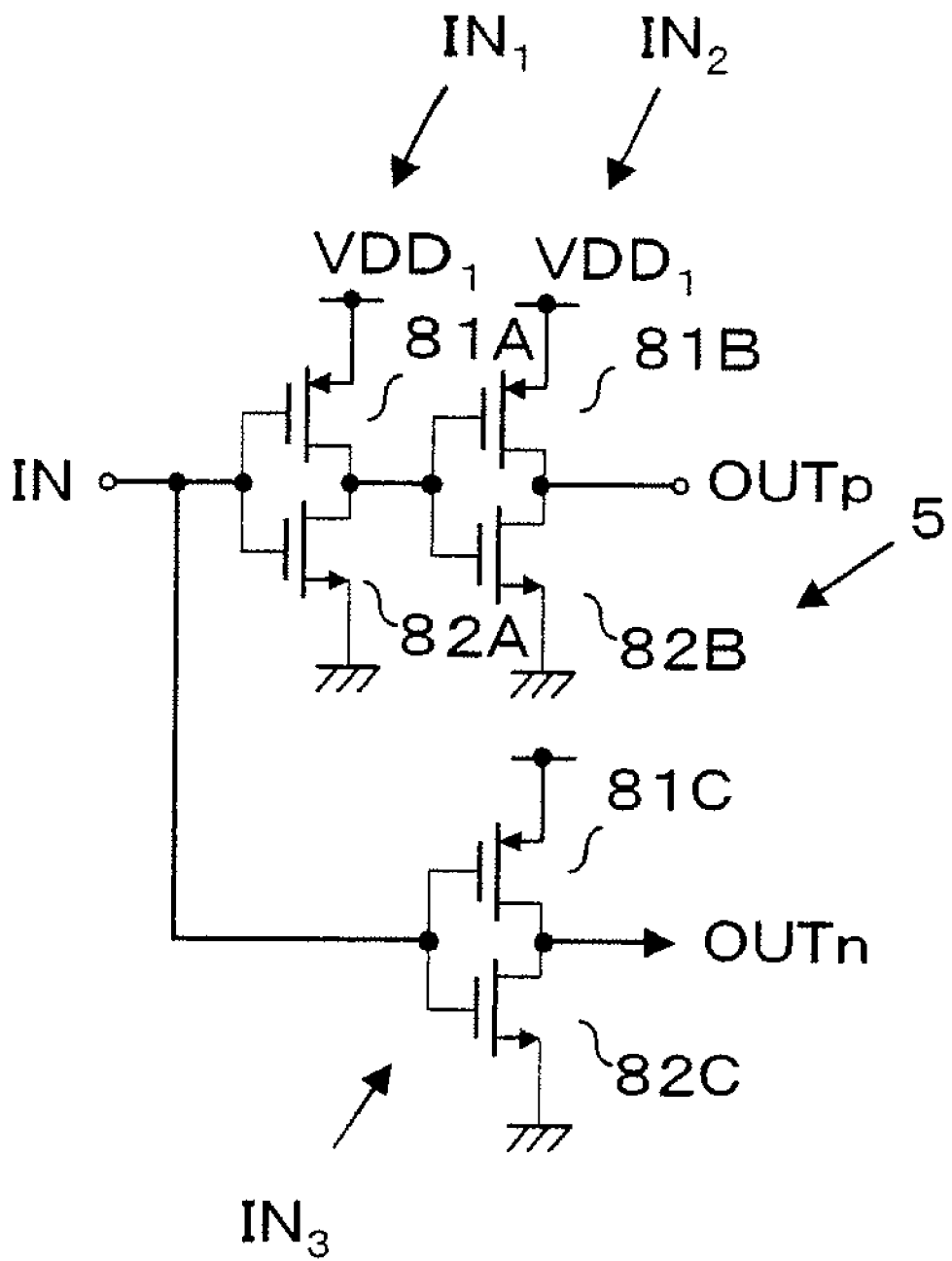
FIG. 15 is a circuit diagram showing an example of a buffer circuit.
Figure 16:
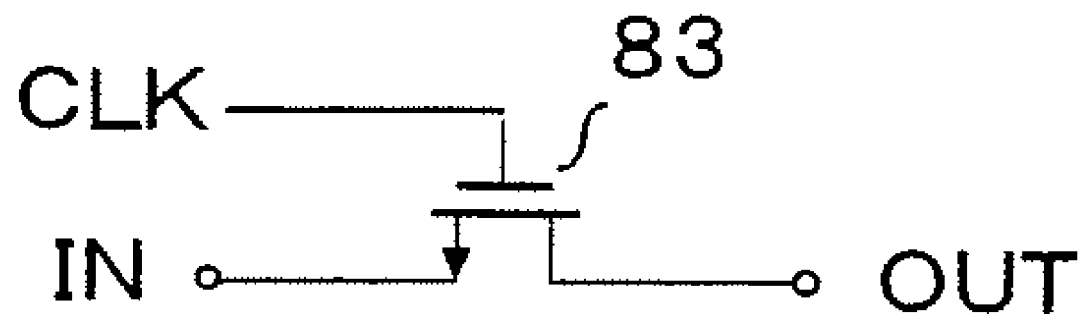
FIG. 16 is a circuit diagram showing an example of a switch circuit.
Figure 17:
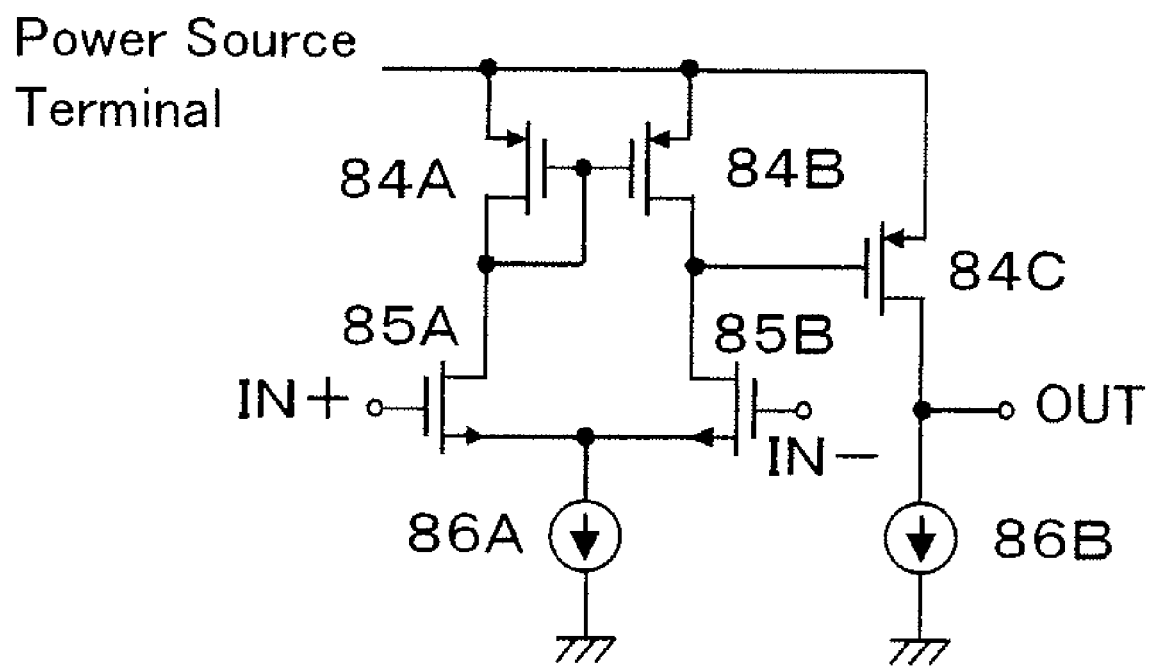
FIG. 17 is a circuit diagram showing an example of respective circuits in an operational amplifier and a comparator.
Figure 18:
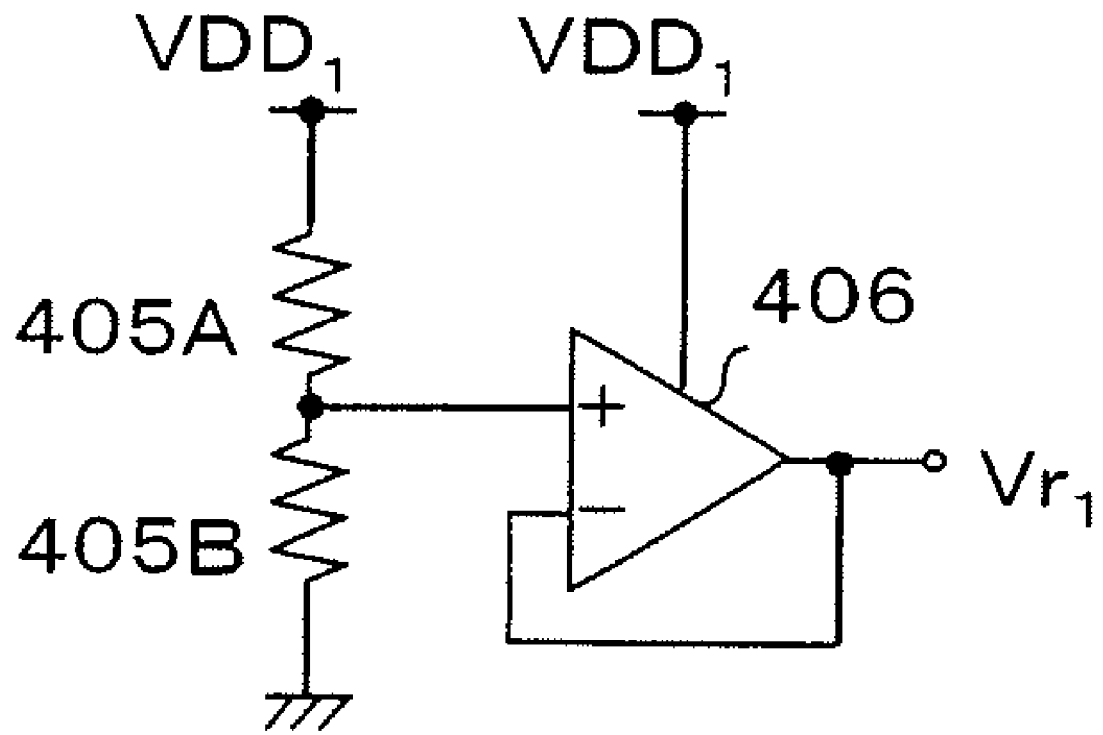
FIG. 18 is a circuit diagram showing an example of a reference voltage generation circuit.

FIG. 12A shows a part of the circuit of FIG. 5. The drawing shows the structure in which the first integration circuit 210 is supplied with the power source voltage $VDD_1$ from the power source terminal 801, and the second integration circuit 211, the quantizer 302, and the delayer 9 are each supplied with the power source voltage $VDD_2$ from the power source terminal 802. However, as shown in FIG. 12B, the integration circuit 211, the adder/subtractor 204, the amplifier 222, and the DA converter 231 are composed of, e.g., the operational amplifier 107, the capacitors C21 to C24, the switches 161 to 172, and the buffers 105 and 108, and it is not necessary to supply the power source voltage $VDD_2$ to all of the components. In the example of FIG. 12B, the operational amplifier 107 is supplied with the power source voltage $VDD_1$, and the drive circuit for the switches 162 to 172 and the operational amplifier 202 composing the quantizer are each supplied with the power source voltage $VDD_2$. However, the structure may also be adopted in which the drive circuit for the switches 161 to 172 is supplied with the power source voltage $VDD_1$, and the operational amplifier 107 is supplied with the power source voltage $VDD_2$ in a manner converse to that used in the example of FIG. 12B. FIG. 12C shows an example of the buffer (drive circuit) supplied with the power source voltage $VDD_2$ and FIG. 12D shows a specific example of the switch driven by the buffer of FIG. 12C.

The operational amplifier 202 composing the quantizer 202 may also be supplied with either the voltage $VDD_2$ or the voltage $VDD_1$.

In short, the effect of a reduction in power consumption can be attained without degrading the SNR, provided that the voltage supplied to at least one of the operational amplifier 107, the buffers 105 and 108 each as the drive circuit, and the operational amplifier 202 composing the quantizer is the voltage $VDD_2$ which is lower than the voltage $VDD_1$. When the structure is adopted in which the voltage $VDD_2$ is supplied to all of the components mentioned above, the maximum effect is attained.

The delta sigma modulator of the present invention shown in FIGS. 1, 5, 6, 9, and 10 can be used also in a delta sigma modulator having a multiple order configuration. Moreover, the quantizer and the DA converter can also be used with a two or more bit signal. Furthermore, three or more different power source voltages may also be supplied by increasing the number of the power source terminals to three or more.

INDUSTRIAL APPLICABILITY

The delta sigma modulator according to the present invention has the effect of allowing a reduction in power consumption without degrading the SNR, and is useful as an A/D conversion circuit for digital audio equipment or the like.

What is claimed is:

1. A delta sigma modulator including a first integration circuit, a second integration circuit for integrating an output of the first integration circuit, and a quantizer for quantizing an output of the second integration circuit, an output of the quantizer being feedbacked to the input side of the first integration circuit, the delta sigma modulator comprising:
   a first power source terminal for supplying a first operation power source voltage to the first integration circuit; and a second power source terminal for supplying a second operation power source voltage lower than the first operation power source voltage to the second integration circuit, wherein:

the first integration circuit includes a first capacitor, a first switch for intermittently interrupting a charge/discharge current to the first capacitor, and a first drive circuit supplied with the first operation power source voltage to drive the first switch, and the second integration circuit includes a second capacitor, a second switch for intermittently interrupting a charge/discharge current to the second capacitor, and a second drive circuit supplied with the second operation power source voltage to drive the second switch.

2. The delta sigma modulator according to claim 1, wherein the second operation power source voltage is supplied from the second power source terminal to the quantizer.

3. The delta sigma modulator according to claim 1, wherein the first integration circuit includes a first operational amplifier supplied with the first operation power source voltage, and the second integration circuit includes a second operational amplifier supplied with the second operation power source voltage.

4. The delta sigma modulator according to claim 1, wherein the first drive circuit receives a signal in accordance with a level of a power source voltage supplied to the second power source terminal, and outputs a signal in accordance with a level of a power source voltage supplied to the first power source terminal.

5. A delta sigma modulator including a first integration circuit, a second integration circuit for integrating an output of the first integration circuit, and a quantizer for quantizing an output of the second integration circuit, an output of the quantizer being feedbacked to the input side of the first integration circuit, the delta sigma modulator comprising:

a first power source terminal for supplying a first operation power source voltage to the first integration circuit; and a second power source terminal for supplying a second operation power source voltage lower than the first operation power source voltage to the second integration circuit, wherein:

feedback paths from an output terminal of the quantizer to the input sides of the first and second integration circuits are provided with first and second DA converters receiving the output of the quantizer to generate first and second feedback reference voltages to be inputted to the first and second integration circuits, and the first and second feedback reference voltages are generated based on respective power source voltages supplied to the first and second power source terminals.

* * * * *